US012469667B2

(12) United States Patent
Mustapha et al.

(10) Patent No.: US 12,469,667 B2
(45) Date of Patent: Nov. 11, 2025

(54) COMPACT 2D SCANNER MAGNET WITH TRAPEZOIDAL COILS

(71) Applicants: UCHICAGO ARGONNE, LLC, Chicago, IL (US); Brookhaven Science Associates, LLC, Upton, NY (US)

(72) Inventors: Brahim Mustapha, Naperville, IL (US); Jerry A. Nolen, Jr., Chicago, IL (US); Nicholaos Tsoupas, East Moriches, NY (US)

(73) Assignees: UCHICAGO ARGONNE, LLC, Chicago, IL (US); Brookhaven Science Associates, LLC, Upton, NY (US)

( * ) Notice: Subject to any disclaimer, the term of this patent is extended or adjusted under 35 U.S.C. 154(b) by 357 days.

(21) Appl. No.: 18/202,767

(22) Filed: May 26, 2023

(65) Prior Publication Data

US 2024/0395495 A1 Nov. 28, 2024

(51) Int. Cl.
*H01J 37/147* (2006.01)

(52) U.S. Cl.
CPC ... *H01J 37/1475* (2013.01); *H01J 2237/0473* (2013.01); *H01J 2237/061* (2013.01); *H01J 2237/1518* (2013.01)

(58) Field of Classification Search
CPC ................... H01J 37/00; H01J 37/1475; H01J 2237/0473; H01J 2237/061; H01J 2237/1518
USPC .......................................... 250/492.3, 492.22
See application file for complete search history.

(56) References Cited

U.S. PATENT DOCUMENTS 6,403,967 B1 * 6/2002 Chen ........................ H01J 37/05 250/281
2013/0256552 A1 * 10/2013 Glavish .................... H01J 37/05 250/396 ML
2016/0030769 A1 2/2016 Cameron et al.
2017/0076908 A1 * 3/2017 Buff ........................ H01J 37/14

OTHER PUBLICATIONS

Anferov, Vladimir, "Combined X-Y scanning magnet for conformal proton radiation therapy," Medical Physics, vol. 32, pp. 815-818 (2005).

* cited by examiner

*Primary Examiner* — Jason L McCormack
(74) *Attorney, Agent, or Firm* — MARSHALL, GERSTEIN & BORUN LLP

(57) ABSTRACT

A compact two-dimensional (2D) scanning magnet for scanning ion beams is provided. The compact 2D scanning magnet may include a vertical field trapezoidal coil and a horizontal field trapezoidal coil that is disposed proximate to the vertical field trapezoidal coil and is rotated about an axis relative to the vertical field trapezoidal coil. The vertical field trapezoidal coil may include a top coil that is configured to receive a first input electrical current flowing in a first direction, and a bottom coil that is configured to receive a second input electrical current flowing in the first direction. The horizontal field trapezoidal coil may include a left coil that is configured to receive a third input electrical current flowing in a second direction, and a right coil that is configured to receive a fourth input electrical current flowing in the second direction.

20 Claims, 18 Drawing Sheets

COMPACT 2D SCANNER MAGNET WITH TRAPEZOIDAL COILS

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory and under Contract No. DE-DE-SC0012704 awarded by the United States Department of Energy to Brookhaven Science Associates, LLC operator of Brookhaven National Laboratory. The government has certain rights in the invention.

FIELD OF THE DISCLOSURE

The present disclosure relates to methods and systems for scanning ion beams, and specifically, to compact two-dimensional ("2D") scanning magnets for scanning ion beams.

BACKGROUND

Particle therapy has been a staple of cancer treatment regimens for decades. Particle therapy generally involves directing a beam of high energy particles such as electrons, protons, or heavy ions into a target volume (e.g., a tumor or lesion) in a patient. Particle therapy has proven to be a precise and conformal technique where a high dose of these high energy particles to a target volume can be delivered while minimizing the dose to surrounding healthy tissues.

A standard particle therapy apparatus includes an accelerator producing energetic charged particles, a beam transport system for guiding the particle beam to one or more treatment rooms and, for each treatment room, a particle beam delivery system. Generally, beam delivery systems are categorized into one of two broad categories: fixed beam delivery systems delivering the particle beam to the target from a fixed irradiation direction, and rotating beam delivery systems capable of delivering the particle beam to the target from multiple irradiation directions. Such a rotating beam delivery system is typically called a gantry, and the target volume in such systems is generally positioned at a fixed position defined by the crossing of the rotation axis of the gantry and the particle beam propagation axis.

Each beam delivery system includes devices for shaping the particle beam to match the target. Typically, particle beam shaping is performed by one of two techniques: passive scattering techniques or dynamic radiation techniques. One example of a dynamic radiation technique is the pencil beam scanning (PBS) technique. In PBS, a narrow pencil-shaped particle beam is magnetically scanned on a plane orthogonal to the propagation direction of the particle beam. Fine-tuned control of the scanning magnets enables PBS techniques (and other dynamic radiation techniques) to achieve significant lateral conformity with the target volume. Further, these dynamic radiation techniques are generally capable of irradiating different layers in the target volume by varying the energy of the particle beam, thereby enabling delivery of particle radiation doses to the entire three-dimensional (3D) target volume.

However, despite the successes of particle therapy techniques, such techniques still suffer from particle beam delivery inaccuracy that inadvertently places healthy tissue in the path of harmful radiation intended for the target volume. In particular, conventional scanning magnets used in such therapy techniques generate magnetic fields that are non-uniform in both scanning directions (e.g., X and Y directions relative to the Z direction of the particle beam propagation), causing the particle beam to deviate from the intended position during treatment. The scanning patterns produced by such conventional scanning magnets usually start at the most distal edge of the target volume at a given depth until the scanned particle beam irradiates each point of the target volume at the given depth and reaches the most proximal edge of the target object. When conventional scanning magnets direct a particle beam along the distal, proximal, and any other edge of the target object, the non-uniformities of the magnetic fields within the conventional scanning magnets may cause a charged particle (or more often, many charged particles) to deviate from the intended target area on the target volume.

The issues stemming from such deviations are two-fold. First, the deviated charged particles may inadvertently irradiate healthy tissue, causing damage to otherwise healthy organs. Second, portions of the target volume may not receive the intended dose of radiation, and may thereby remain intact/undamaged within the patient. Both issues can result in additional complications for a patient that would likely not have developed but for the inaccuracy of the conventional scanning magnets. For example, irradiating healthy tissue and failing to irradiate a target volume can lead to continued health issues for a patient (e.g., cancer recurrence), which can result in additional visits to a healthcare professional, vastly increased healthcare costs, and an overall lower quality of life.

Accordingly, there is a need for improved scanning magnets that can accurately scan particle beams during particle therapy to avoid the above-referenced issues.

SUMMARY OF THE DISCLOSURE

In an example embodiment, a compact two-dimensional (2D) scanning magnet for scanning ion beams is provided. The compact 2D scanning magnet may include a vertical field trapezoidal coil oriented along an axis comprising: a top coil that is configured to receive a first input electrical current flowing through the top coil in a first direction, and a bottom coil that is configured to receive a second input electrical current flowing through the bottom coil in the first direction; and a horizontal field trapezoidal coil that is disposed proximate to the vertical field trapezoidal coil and is rotated about the axis relative to the vertical field trapezoidal coil by an angle, the horizontal field trapezoidal coil comprising: a left coil that is configured to receive a third input electrical current flowing through the left coil in a second direction, and a right coil that is configured to receive a fourth input electrical current flowing through the right coil in the second direction, wherein the vertical field trapezoidal coil and the horizontal field trapezoidal coil are configured to scan an input ion beam across a 2D target area.

In another example embodiment, a system for scanning ion beams is provided. The system may include an accelerator for accelerating an ion beam towards a two-dimensional (2D) target area, and a 2D scanning magnet configured to scan the ion beam across the 2D target area. The 2D scanning magnet may include: a vertical field trapezoidal coil oriented along an axis comprising: a top coil that is configured to receive a first input electrical current flowing through the top coil in a first direction, and a bottom coil that is configured to receive a second input electrical current flowing through the bottom coil in the first direction; and a horizontal field trapezoidal coil that is disposed proximate to the vertical field trapezoidal coil and is rotated about the axis relative to the vertical field trapezoidal coil by an angle, the horizontal field trapezoidal coil comprising: a left coil that is configured to receive a third input electrical current flowing through the left coil in a second direction, and a right coil that is configured to receive a fourth input electrical current flowing through the right coil in the second direction.

In a further example embodiment, a method for scanning ion beams is provided. The method may include directing an ion beam along an axis towards a 2D scanning magnet configured to scan the ion beam across a 2D target area. The 2D scanning magnet may include: a vertical field trapezoidal coil oriented along an axis comprising: a top coil that is configured to receive a first input electrical current flowing through the top coil in a first direction, and a bottom coil that is configured to receive a second input electrical current flowing through the bottom coil in the first direction; and a horizontal field trapezoidal coil that is disposed proximate to the vertical field trapezoidal coil and is rotated about the axis relative to the vertical field trapezoidal coil by an angle, the horizontal field trapezoidal coil comprising: a left coil that is configured to receive a third input electrical current flowing through the left coil in a second direction, and a right coil that is configured to receive a fourth input electrical current flowing through the right coil in the second direction; and. The method may also include scanning the ion beam across the 2D target area in a first direction and a second direction by sequentially adjusting a propagation direction of the ion beam with the 2D scanning magnet, wherein the first direction and the second direction are orthogonal to the axis.

BRIEF DESCRIPTION OF THE DRAWINGS

The Figures described below depict various aspects of the system and methods disclosed therein. It should be understood that each figure depicts an example of a particular aspect of the disclosed system and methods, and that each of the figures is intended to accord with a possible example thereof. Further, wherever possible, the following description refers to the reference numerals included in the following figures, in which features depicted in multiple figures are designated with consistent reference numerals.

There are shown in the drawing arrangements which are presently discussed, it being understood, however, that the present examples are not limited to the precise arrangements and instrumentalities shown, wherein.

DETAILED DESCRIPTION

The present disclosure is directed to a scanning magnet design that improves the accuracy of a particle beam (referenced herein as an "ion beam") delivered during ion beam therapy. Scanning magnets may include multiple magnets generating tunable magnetic fields that adjust the propagation direction of an input ion beam along orthogonal axes to the ion beam propagation axis. Each magnet generally includes an electrically conductive material, and electrical current is run through the material to generate the magnetic fields. As the electrical current is adjusted, so too is the corresponding magnetic field, resulting in the adjustments to the propagation direction of the input ion beam. However, in conventional scanning magnets, these magnetic fields are non-uniform in at least one direction, causing inaccuracies in the adjustments to the ion beam propagation direction.

The scanning magnet design of this disclosure includes trapezoidal coils of different sizes and at different orientations. The two trapezoidal coils are arranged such that the magnetic fields generated by both coils are significantly more uniform than conventional scanning magnets. In particular, the two trapezoidal coils of the present disclosure yield a more uniform transverse magnetic field than conventional scanning magnets. Such uniform and symmetrical magnetic fields result in a more uniform 2D scanning of ion beams during ion therapy. As a result, the scanning magnets of the present disclosure increase the accuracy of ion beams delivered during ion therapy, thereby minimizing the inadvertent irradiation of healthy tissue and maximizing the intended dose of radiation delivered to the target volume.

Of course, it should be appreciated that the scanning magnet design of this disclosure is discussed in the context of ion beam therapy for discussion purposes only. The scanning magnet design of this disclosure may be adapted for any charged beam scanning, such as electrons, protons, etc., and for any suitable application wherein greater field uniformity is desired.

Figure 1A:
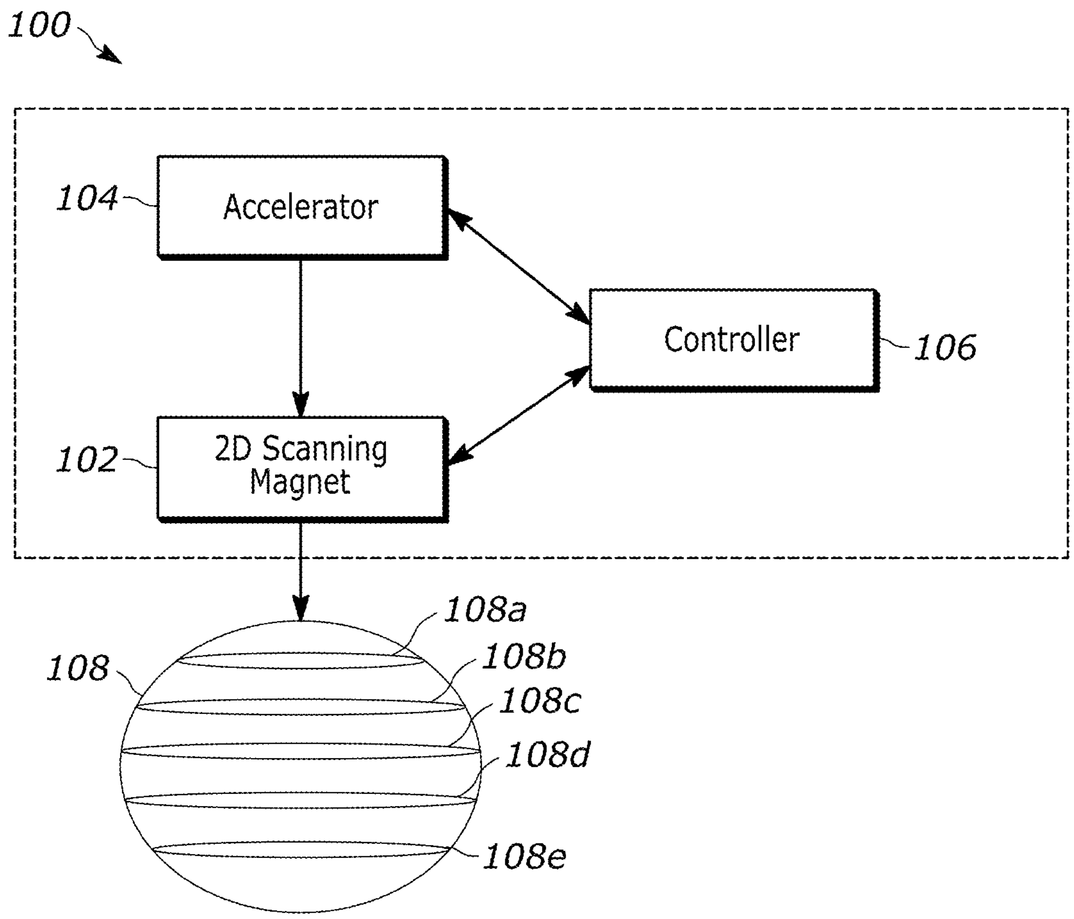
FIG. 1A illustrates an example system for scanning ion beams with a two-dimensional (2D) scanning magnet configured in accordance with the techniques of the present disclosure, in accordance with some embodiments.
Figure 1B:
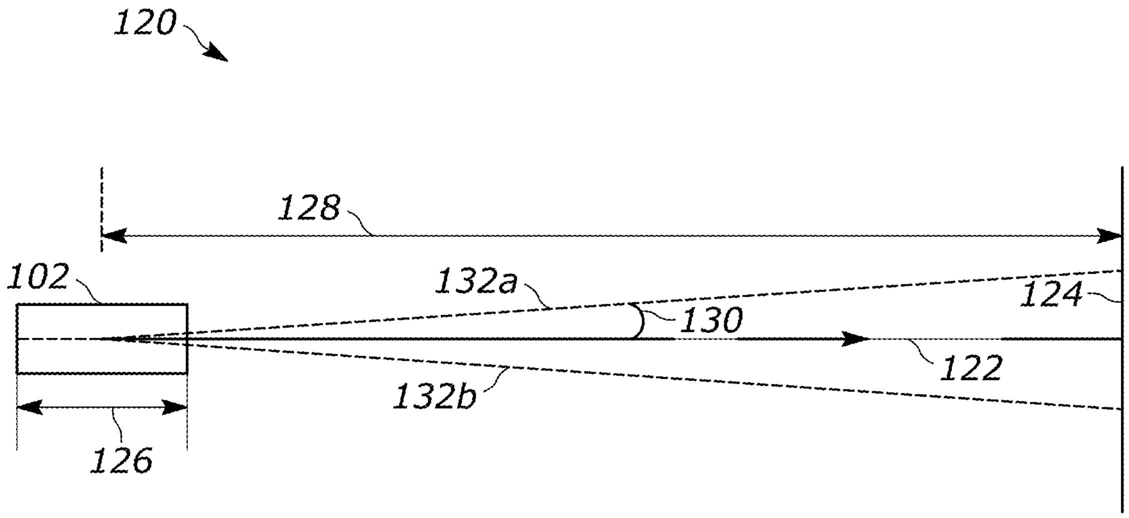
FIG. 1B illustrates an example scanning configuration for the 2D scanning magnet configured in accordance with the techniques of the present disclosure, such as the 2D scanning magnet of FIG. 1A.
Figure 2A:
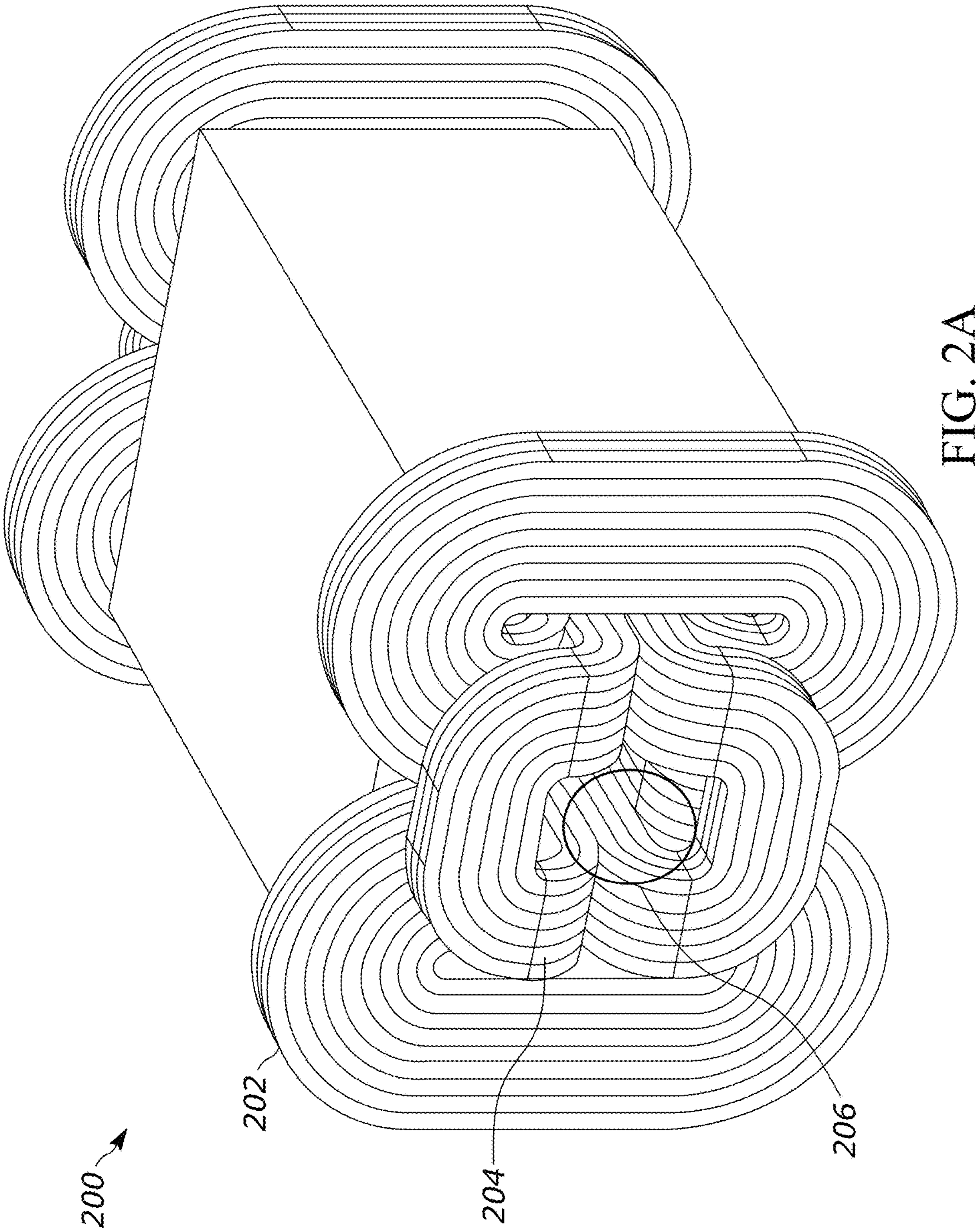
FIG. 2A (Prior Art)
FIG. 2A is an example prior art scanning magnet.
Figure 2B:
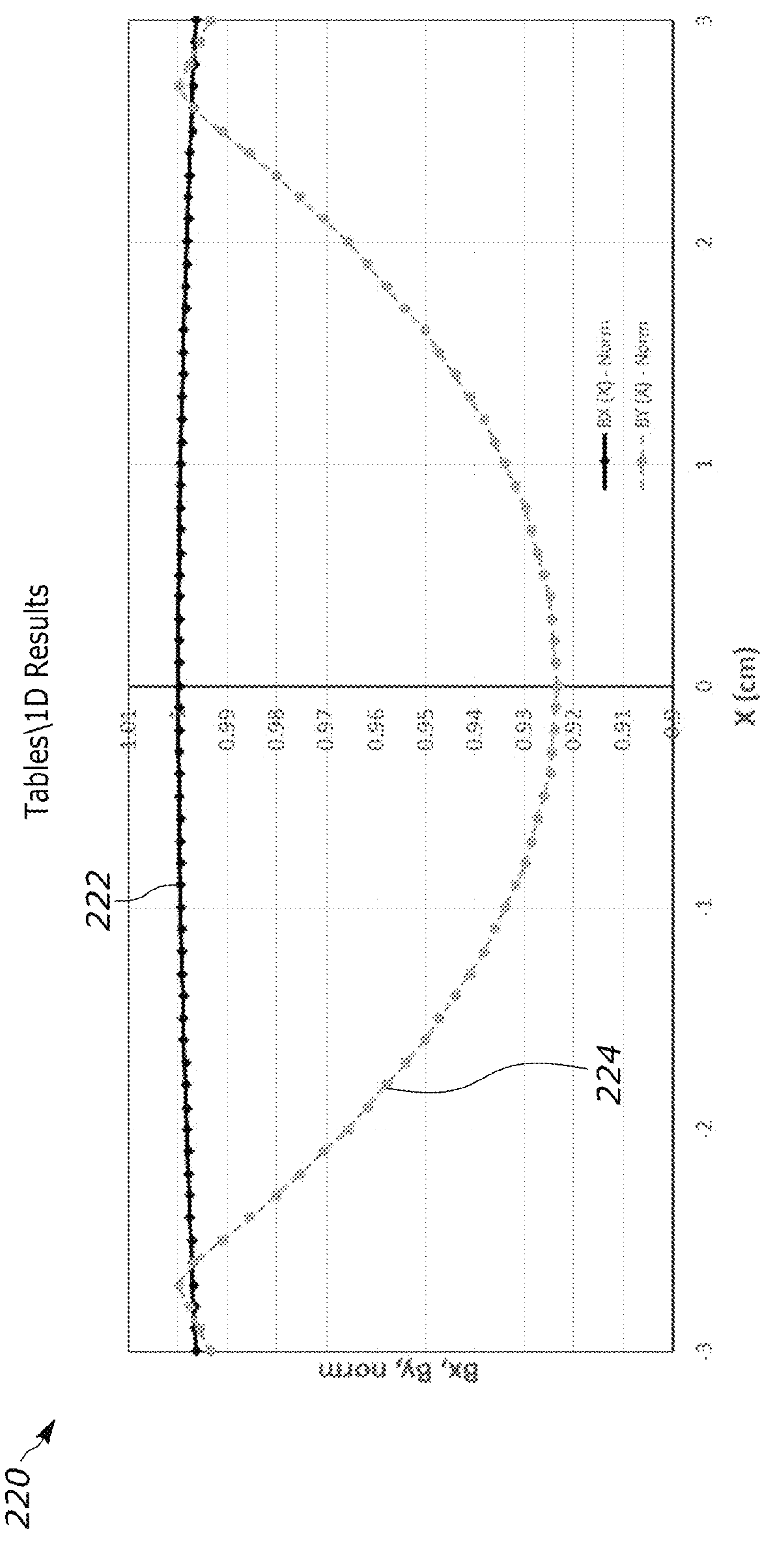
FIG. 2B (Prior Art)
FIG. 2B is an example graph illustrating magnetic field components across a horizontal scanning direction of the prior art scanning magnet of FIG. 2A.
Figure 2C:
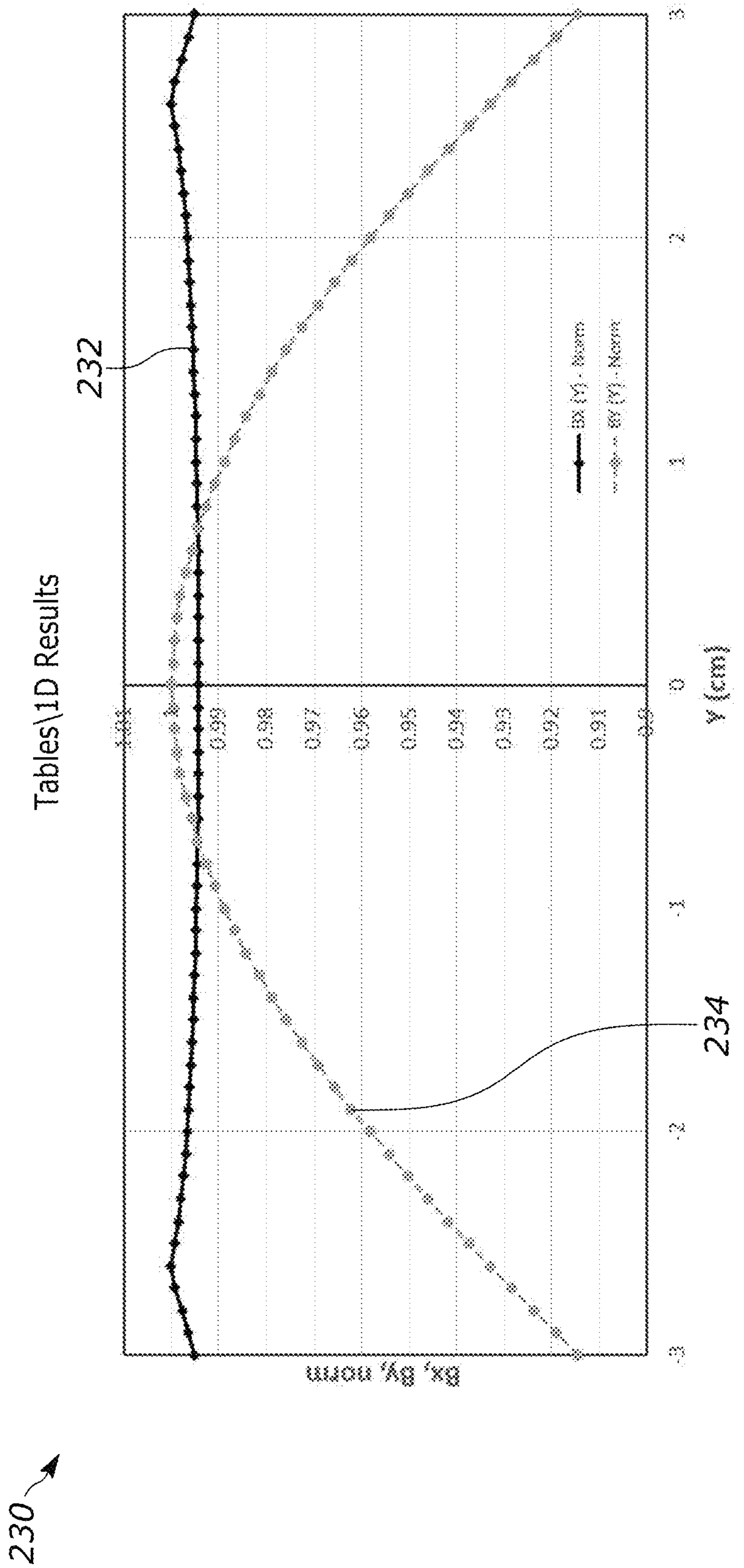
FIG. 2C (Prior Art)
FIG. 2C is an example graph illustrating magnetic field components across a vertical scanning direction of the prior art scanning magnet of FIG. 2A.

The scanning magnet design of this disclosure is primarily referred to with reference to FIGS. 3A-4B. FIGS. 1A and 1B are included to illustrate example environments and example operations that include the scanning magnet design of this disclosure. FIGS. 2A-2C are included to provide a better understanding of conventional scanning magnets and the issues arising therefrom.

Turning to the Figures, FIG. 1A illustrates an example system 100 for scanning ion beams with a two-dimensional (2D) scanning magnet 102 configured in accordance with the techniques of the present disclosure, in accordance with some embodiments. It should be appreciated that the example system 100 is merely an example and that alternative or additional components are envisioned. The system 100 includes the 2D scanning magnet 102, an accelerator 104, and a controller 106. Collectively, the system 100 operates to irradiate a target volume 108, which may be a tumor or other foreign object within a patient.

Generally, the accelerator 104 (e.g., a linear accelerator) may accelerate an ion beam until the beam is extracted from the accelerator 104 in order to irradiate a target volume 108. Prior to reaching the target volume 108, the ion beam passes through the 2D scanning magnet 102, where the ion beam is steered by the 2D scanning magnet in order to scan across a 2D target area of the target volume 108. The controller 106 operates to control the accelerator 104 and the 2D scanning magnet 102 such that the ion beam energy and scanning direction are adjusted appropriately to complete an ion therapy treatment. Optionally, one or more additional devices, such as a monitoring unit (not shown), an energy degrader (not shown), and/or any other suitable devices or combinations thereof may be placed along the propagation direction of the ion beam.

The target volume 108 to be irradiated by the ion beam as part of ion beam therapy treatment has a three-dimensional configuration. In some instances, to carry-out the ion beam therapy treatment, the target volume 108 is divided into target layers 108*a-e* along the irradiation direction of the ion beam so that the irradiation can be done on a layer-by-layer basis. Broadly speaking, the penetration depth (or which target layer 108*a-e* the ion beam reaches) within the target volume 108 is largely determined by the energy of the ion beam. An ion beam of a given energy does not reach substantially beyond a corresponding penetration depth for that energy. Thus, to move the ion beam irradiation from one layer to another layer of the target volume 108, thereby irradiating the entirety of the target volume 108, the controller 106 may change the energy of the ion beam.

In the example shown in FIG. 1A, the target volume 108 is divided into five target layers 108*a*-108*e* along the propagation direction of the ion beam from the 2D scanning magnet 102 to the target volume 108. In an example ion beam therapy treatment, the irradiation starts from the deepest target layer 108*e*, gradually moves to the shallower target layers (e.g., 108*b*, 108*c*, 108*d*) one layer at a time, and finishes with the shallowest target layer 108*a*. Before application to the patient's body (e.g., the target volume 108), the energy of the ion beam is controlled by the controller 106 to exit the accelerator 104 at a level sufficient to enable the ion beam to stop at a desired target layer (e.g., any of target layers 108*a*-108*e*), without substantially penetrating further into the patient's body or the target volume 108. Accordingly, and in reference to the prior example, the energy of the ion beam may sequentially decrease corresponding to the depth of the desired target layer 108*a*-108*e* relative to the system 100. In certain instances, the ion beam energy difference for treating adjacent target layers 108*a-e* of the target volume 108 may be between 3 Mega electron-volts (MeV) and 100 MeV. However, other ion beam energy differences may also be possible, depending on, e.g., the thickness of the target layers 108*a*-108*e* and the properties of the ion beam.

The energy variation for treating different target layers 108*a-e* of the target volume 108 is generally performed at the accelerator 104 such that, in some instances, no additional energy variation is required after the ion beam is extracted from the accelerator 104. In certain instances, the accelerator 108 can output ion beams having an energy that varies between about 100 MeV and about 300 MeV. The ion beam energy variation can be continuous or non-continuous (e.g., stepwise). In some instances, the accelerator 104 may vary the ion beam energy, continuously or non-continuously, at between 50 MeV per second and 20 MeV per second. More specifically, the accelerator 104 may vary the ion beam energy non-continuously with a step size between 10 MeV and 90 MeV.

When irradiation is complete in one target layer 108*a-e*, the accelerator 104 may vary the energy of the ion beam for irradiating a subsequent layer within several seconds or within less than one second. In some instances, the treatment of the target volume 108 may be continued without substantial interruption or without any interruption. Moreover, in certain circumstances, the step size of the non-continuous energy variation may be selected to correspond to the energy difference needed for irradiating two adjacent target layers 108*a-e* of the target volume 108. For example, the step size can be identical to, or a fraction of, the energy difference needed to irradiate two adjacent target layers 108*a*-108*e*.

Regardless, when the accelerator 104 has adjusted the energy of the ion beam to irradiate a target layer 108*a-e*, the ion beam passes through the 2D scanning magnet 102 where it is scanned across the surface of the target layer 108*a-e*. The 2D scanning magnet 102 of the present disclosure includes two trapezoidal coils that optimally scan the ion beam across the surface of a target layer 108*a-e* without inadvertently misdirecting the ion beam due to non-uniformity of the steering magnetic fields. The controller 106 may adjust the electrical current sent to drive the 2D scanning magnet 102, and as a result, may adjust the propagation direction of the ion beam as the ion beam passes through the 2D scanning magnet 102.

To provide a better understanding of the scanning performed by the 2D scanning magnet 102, FIG. 1B illustrates an example scanning configuration 120 for the 2D scanning magnet 102 configured in accordance with the techniques of the present disclosure. The example scanning configuration 120 includes the 2D scanning magnet 102 directing an ion beam 122 (also referenced herein as a "carbon ion beam 122") towards a target volume surface 124. Generally, the 2D scanning magnet 102 may have a given length 126, and may be placed at a scan distance 128 from the target volume surface 124. As an example, the given length 126 of the 2D scanning magnet 102 may be between 50 centimeters and 80 centimeters, such as 65 centimeters, and/or any other suitable length or combinations thereof. The scan distance 128 from the 2D scanning magnet 102 to the target volume surface 124 may be between 2 meters and 4 meters, such as 3 meters, and/or any other suitable distance or combinations thereof.

However, the scan distance 128 may be determined, in part, based on the necessary scanning range of the 2D scanning magnet 102. As illustrated in FIG. 1B, the 2D scanning magnet 102 may adjust (steer) the propagation direction of the ion beam 122 through a range of motion defined by the scanning angle 130. The scanning angle 130 may represent a maximum deviation from the original propagation direction of the ion beam 122 as it enters the 2D scanning magnet 102 by which the magnet 102 is configured to adjust the propagation direction of the ion beam in order to target a portion of the target volume surface 124. For example, the adjusted ion beam paths 132*a*, 132*b* may illustrate the outer extremities of a range of paths across which the ion beam 122 may travel to irradiate the target volume surface 124.

Accordingly, if the target volume surface 124 is sufficiently large such that the ion beam 122 does not reach the edge portions of the target volume surface 124 at a particular scanning angle 130 and scan distance 128, the scan distance 128 and/or the scanning angle 130 may need to be adjusted. Typically, though, the scan distance 128 and a maximum scanning angle (e.g., scanning angle 130) are predetermined and/or otherwise properly configured such that the entirety of the target volume surface 124 are irradiated by the ion beam 122 during treatment. In any event, the scanning angle 130 may be between 3° and 5°, such as 4°, and/or any other suitable angle or combinations thereof.

More specifically, the ion beam 122 propagating through the 2D scanning magnet 102 may have a range of characteristics suitable for ion beam therapy. For example, the ion beam 122 may be comprised of carbon ions (e.g., $^{12}C^{6+}$) with a corresponding energy of 430 MeV per atomic mass unit (MeV/u) and magnetic rigidity of 6.6 tesla-meters (Tm). In order to scan an ion beam 122 comprised of heavy ions (e.g., $^{12}C^{6+}$), the 2D scanning magnet 102 may generate a peak magnetic field between 0.1 Tesla (T) and 1.5 T, such as 1 T, and/or any other suitable magnetic field strength value. Of course, as previously mentioned, the ion beam 122 may be comprised of any suitable particle(s) (e.g., electrons, protons).

Turning now to FIG. 2A, a prior art scanning magnet design is discussed. FIG. 2A is an example prior art scanning magnet 200. The prior art scanning magnet 200 includes a first coil 202 and a second coil 204 that are configured to receive electrical current and generate corresponding magnetic fields that steer an input particle beam. The first coil 202 is typically referenced as an "elephant ear" magnet design, and the second coil 204 is typically referenced as a "saddle design" corresponding to their respective shapes. The prior art scanning magnet 200 also includes a central aperture 206, through which, a particle beam may propagate in order to be scanned across a target volume by the prior art scanning magnet 200.

Generally, the prior art scanning magnet 200 suffers from a critical drawback. Namely, the generated magnetic fields are non-uniform in at least one direction in which the prior art scanning magnet 200 is intended to steer the particle beam. The prior art scanning magnet 200 is designed for a particle beam composed of relatively light particles (e.g., protons), and as a result, is only configured to generate magnetic fields sufficient to steer these lighter particles. However, even with these relatively light particles, the prior art scanning magnet 200 fails to achieve uniform magnetic field scanning as a consequence of the physical configuration of the magnet 200. Thus, the prior art scanning magnet 200 is insufficient to accurately steer heavier ion beams (e.g., carbon ion beam 122) that may be desirable for particular ion therapy or other therapies/applications due to the high levels of non-uniformity in the generated magnetic fields.

Moreover, as a consequence of the designs of the first coil 202 and the second coil 204, the magnetic fields generated by both coils 202, 204 are non-uniform in at least one direction in which the particle beam is scanned by the prior art scanning magnet 200. To illustrate this non-uniformity, FIG. 2B provides a graph 220 showing the magnetic field components of the prior art scanning magnet 200 in the horizontal scanning direction. The graph 220 may show a measure of uniformity corresponding to the respective magnetic field components of the prior art scanning magnet 200 plotted as a function of the horizontal position within the central aperture 206 of the prior art scanning magnet 200. The central aperture 206 may generally have a diameter of approximately 6 centimeters (cm), such that the horizontal center of the central aperture 206 is designated by 0 on the x-axis, and the +/−3 cm values on the x-axis may approximately represent the horizontal extremities of the central aperture 206.

As illustrated in FIG. 2B, the prior art scanning magnet 200 generates a magnetic field that has components in the horizontal direction (e.g., a lateral direction) relative to the propagation direction of the particle beam, represented by the horizontal field plot line 222. The magnetic field generated by the prior art scanning magnet 200 also has components in the vertical direction relative to the propagation direction of the particle beam, represented by the vertical field plot line 224. The graph 220 shows that the magnetic field is relatively uniform in the horizontal direction, and is generally within 1% of complete uniformity throughout the lateral width of the central aperture 206 of the prior art scanning magnet 200.

However, the graph 220 also shows that the magnetic field is relatively non-uniform in the vertical direction, and deviates by up to approximately 10% of complete uniformity near the center of the central aperture 206 of the prior art scanning magnet 200. As previously mentioned, this non-uniformity in the vertical direction may cause inadvertent adjustments to the scanning of the particle beam, which in turn, may result in inadvertent damage to healthy tissue surrounding a target volume (e.g., target volume 108). Accordingly, a particle traveling as part of the particle beam along the central aperture 206 of the prior art scanning magnet 200 may travel through the center of the central aperture 206, experience an unintended adjustment to its propagation direction resulting from the non-uniformity in the vertical magnetic field component, and exit the central aperture 206 on a collision course with healthy tissue.

This non-uniformity issue is also present in the magnetic fields generated by the prior art scanning magnet 200 in the vertical scanning plane, as illustrated in FIG. 2C. In particular, FIG. 2C provides a graph 230 showing magnetic field components across a vertical scanning plane of the prior art scanning magnet 200. The graph 230 may show a measure of uniformity corresponding to the respective magnetic field components of the prior art scanning magnet 200 plotted as a function of the vertical position within the central aperture 206 of the prior art scanning magnet 200. As previously mentioned, the central aperture 206 may generally have a diameter of approximately 6 centimeters, and as a result, the vertical center of the central aperture 206 is designated by 0 on the x-axis, and the +/−3 centimeter values on the x-axis may approximately represent the vertical extremities of the central aperture 206.

As illustrated in FIG. 2C, the prior art scanning magnet 200 generates a magnetic field that has components in the horizontal direction (e.g., a lateral direction) relative to the propagation direction of the particle beam, represented by the horizontal field plot line 232. The magnetic field generated by the prior art scanning magnet 200 also has components in the vertical direction relative to the propagation direction of the particle beam, represented by the vertical field plot line 234. The graph 230 shows that the magnetic field is relatively uniform in the horizontal direction, and is generally within 1% of complete uniformity throughout the vertical width of the central aperture 206 of the prior art scanning magnet 200.

However, the graph 230 also shows that the magnetic field is relatively non-uniform in the vertical direction, and deviates by up to approximately 10% of complete uniformity near the vertical extremities of the central aperture 206 of the prior art scanning magnet 200. As previously mentioned, this non-uniformity in the vertical direction may cause inadvertent adjustments to the scanning of the particle beam, which in turn, may result in inadvertent damage to healthy tissue surrounding a target volume (e.g., target volume 108). Accordingly, a particle traveling as part of the particle beam along the central aperture 206 of the prior art scanning magnet 200 may travel near a vertical extremity of the central aperture 206, experience an unintended adjustment to its propagation direction resulting from the non-uniformity in the vertical magnetic field component, and leave the central aperture 206 on a collision course with healthy tissue.

Figure 3A:
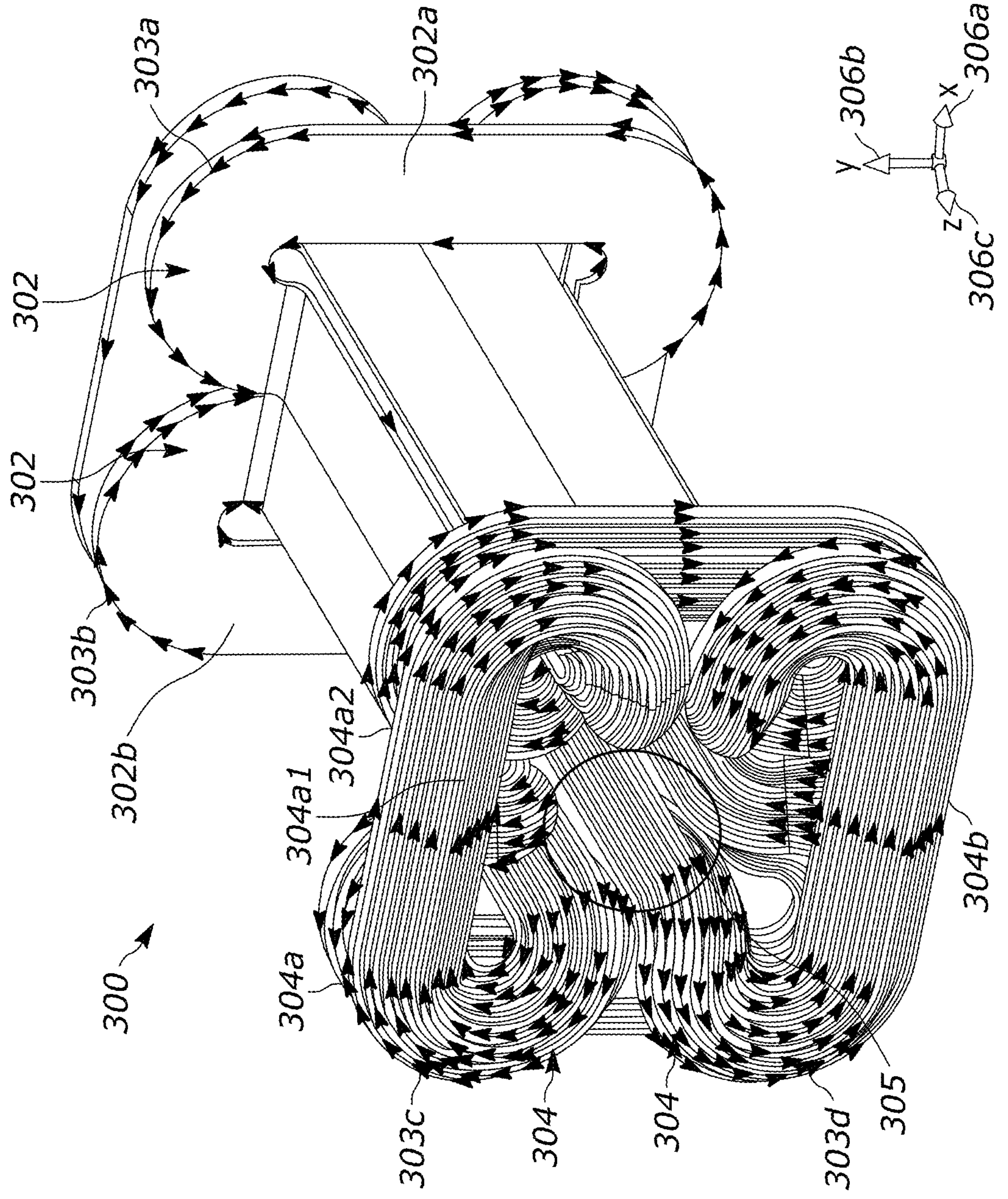
FIG. 3A is an example 2D scanning magnet configured in accordance with the techniques of the present disclosure for scanning ion beams, in accordance with some embodiments.

Advantageously, these magnetic field non-uniformity issues are overcome by the 2D scanning magnet design of the present disclosure. In particular, the 2D scanning magnet design of the present disclosure is illustrated in FIG. 3A. Generally speaking, the 2D scanning magnet 300 is comprised of multiple trapezoidal coils, including a horizontal field trapezoidal coil 302 that comprises a right coil 302*a* and a left coil 302*b*, a vertical field trapezoidal coil 304 that comprises a top coil 304*a* and a bottom coil 304*b*, and a central aperture 305 through which an ion beam may propagate to be scanned across a 2D target area of a target volume (e.g. target volume 108). The coils are referenced herein as “trapezoidal” in shape due to the cross-sectional configuration of the coils, as discussed herein in reference to FIG. 3B. Namely, each trapezoidal coil herein features a trapezoidal cross-section, and each coil referenced herein may include multiple layers of wires forming the trapezoidal cross-sectional shape.

The vertical field trapezoidal coil 304 and the horizontal field trapezoidal coil 302 may be rotated relative to one another in order to generate a magnetic field with almost no high-order components. For example, the rotated configuration of the vertical field trapezoidal coil 304 and the horizontal field trapezoidal coil 302 in the 2D scanning magnet 300 may dramatically reduce the sextupole component of conventional scanning magnets (e.g., prior art scanning magnet 200). In this manner, the vertical field trapezoidal coil 304 and the horizontal field trapezoidal coil 302 generate magnetic fields that enhance the total field uniformity relative to prior art systems, such that the magnetic field in both scanning directions is uniform to within approximately 1% or better. In certain instances, the 2D scanning magnet 300 may be the 2D scanning magnet 102 of FIGS. 1A and 1B. As illustrated in FIG. 3A, the 2D scanning magnet 300 also includes current direction indicators 303*a*, 303*b*, 303*c*, 303*d* that represent the flow of current through the various coils 302*a*, 302*b*, 304*a*, 304*b*.

To more clearly explain how the coils are oriented, the coordinates in FIG. 3A may be used for reference. The coordinates include an X axis 306*a*, a Y axis 306*b*, and a Z axis 306*c*. The Z axis 306*c* may be parallel to the propagation direction of an ion beam along the central aperture 305 of the 2D scanning magnet 300. The Y axis 306*b* may be perpendicular to the propagation direction of an ion beam through the 2D scanning magnet 300, and may correspond to vertical movement relative to the propagation direction of the ion beam. The X axis 306*a* may be perpendicular to the propagation direction of an ion beam through the 2D scanning magnet 300, and may correspond to horizontal movement relative to the propagation direction of the ion beam. Thus, as illustrated in FIG. 3A, the right coil 303*b* may be located adjacent to the left coil 302*b* (i.e., to the right of the left coil 302*b*) along the X axis 306*a* to create the horizontal field trapezoidal coil 302, and the top coil 304*a* may be located adjacent to the bottom coil 304*b* (i.e., above the bottom coil 304*b*) along the Y axis 306*b* to create the vertical field trapezoidal coil 304.

Moreover, the vertical field trapezoidal coil 304 may be rotated around the Z axis 306*c* relative to the horizontal field trapezoidal coil 302. For example, the vertical field trapezoidal coil 304 may be rotated, and thereby offset, relative to the horizontal field trapezoidal coil 302 by an angle of between 80°-100° around the Z axis 306*c*, and more particularly, by an angle (referenced herein as a “relative offset”) of 90° around the Z axis 306*c*. Of course, the relative offset for any particular coil 302, 304 may be measured from any one of the three axes 306*a-c*. For example, the relative offset for the vertical field trapezoidal coil 304 may be measured relative to the Z axis 306*c* or the X axis 306*a*. Similarly, the relative offset for the horizontal field trapezoidal coil 302 may be measured relative to the Z axis 306*c* or the Y axis 306*b*. However, for the purposes of discussion only, the relative offsets referenced herein are relative to the respective axes that are perpendicular to the propagation direction of an ion beam through the 2D scanning magnet 300 (here, the Z axis 306*c*).

Further, coils may be described as rotated relative to one another herein based on the relative orientation of the trapezoidal cross-sections for those particular coils. For example, the top coil 304*a* of the vertical field trapezoidal coil 304 may be rotated relative to the right coil 302*a* of the horizontal field trapezoidal coil 302 because the trapezoidal cross-section of both coils 304*a*, 302*a* is identical, and the trapezoid formed by the cross-section of the top coil 304*a* is rotated (e.g., by 90° around the Z axis 306*c*) relative to the trapezoid formed by the cross-section of the right coil 302*a*. Thus, in a similar manner, the vertical field trapezoidal coil 304 may be rotated relative to the horizontal field trapezoidal coil 302 because the trapezoidal cross-sections of both coils 302, 304 is identical, and the trapezoids formed by the cross-sections of the vertical field trapezoidal coil 304 is rotated (e.g., by 90° around the Z axis 306*c*) relative to the trapezoids formed by the cross-sections of the horizontal field trapezoidal coil 302.

As illustrated in FIG. 3A, the top coil 304*a*, the bottom coil 304*b*, the left coil 302*b*, and the right coil 302*a* may each have 10 layers, such that the vertical field trapezoidal coil 304 and the horizontal field trapezoidal coil 302 may be comprised of two 10-layered coils. For example, each of the top coil 304*a*, the bottom coil 304*b*, the left coil 302*b*, and the right coil 302*a* may include an outermost layer that is a single wire conformed to the shape of the coils. The outermost layer may extend/run along the longitudinal dimension (e.g., along the Z-axis 306*c*) of the 2D scanning magnet 300 in parallel with the central aperture 305 twice, and as such may account for one “turn” along the central aperture 305. Each subsequent layer up to the innermost layer may include two additional wires conformed to the shape of the coils, resulting in two additional turns along the central aperture 305, and forming a triangular cross-section.

However, for optimal magnetic field control of the ion beam, the meeting point between two adjacent coils (e.g., the top coil 304*a* and the bottom coil 304*b*) within the central aperture 305 may not include one or more wires on the meeting point side of the innermost layer. As a result, the innermost layer and/or one or more other layers proximate to the innermost layer (e.g., the N−1, N−2 layers, where N is the total number of layers) may include a non-symmetric number of layers on either side of the outermost layer, thereby creating the trapezoidal cross-section for all coils 302*a*, 302*b*, 304*a*, 304*b*. This trapezoidal cross-section is also illustrated and discussed in reference to FIG. 3B.

As another example, the top coil 304*a* includes an outermost layer 304*a*1 that is a single wire conformed to the shape of the top coil 304*a*. As illustrated in FIG. 3A, the top coil 304*a* also includes an innermost layer 304*a*2 that has seventeen wires stacked on top of one another and displaced behind (e.g., in a direction antiparallel to the Z axis 306*c*) the outermost layer 304*a*1. The innermost layer 304*a*2 has seven wires extending above the outermost layer 304*a*1 (e.g., in the direction of the Y axis 306*b*), one wire in the same vertical position as the outermost layer 304*a*1, and nine wires extending below the outermost layer 304*a*1 (e.g., in the antiparallel direction of the Y axis 306*b*). In this example, the innermost layer 304*a*2 may include as many wires extending above the outermost layer 304*a*1 as the two prior layers because the two additional wires extending below the outermost layer 304*a*1 are not included on the top of the innermost layer 304*a*2. Thus, the cross-section for the top coil 304*a* may appear trapezoidal due to the asymmetry resulting from the different number of wires included in the innermost layer 304*a*2 and/or other prior layers. In any event, it will be appreciated that the top coil 304*a*, the bottom coil 304*b*, the left coil 302*b*, and the right coil 302*a* may have any suitable number of coil layers, such as 5, 10, and/or any other suitable number.

Additional coil layers may, for example, add approximately 0.1 T to the peak magnetic field. However, in order to maintain a uniform and symmetric magnetic field, for every additional layer added to any coil 302*a*, 302*b*, 304*a*, 304*b*, an additional layer must be added to the adjacent coil to cancel the unwanted components of the magnetic field. For example, if an additional coil layer is added to the right coil 302*a*, then an additional coil layer must be added to the left coil 302*b* in order to keep the resulting magnetic field symmetric and uniform. Additionally, the vertical field trapezoidal coil 304 and the horizontal field trapezoidal coil 302 may be independently configured to have different peak magnetic field values that are sufficient for steering particle beams comprising any suitable particles (e.g., proton beams, ion beams). As an example, the horizontal field trapezoidal coil 302 may be configured for a peak magnetic field value between 0.3-0.5 T, and the vertical field trapezoidal coil 304 may be configured for a peak magnetic field value between 0.8-1.0 T. Of course, the peak magnetic field values for the vertical field trapezoidal coil 304 and the horizontal field trapezoidal coil 302 may be any suitable values.

As previously mentioned, both the vertical field trapezoidal coil 304 and the horizontal field trapezoidal coil 302 may include a certain number of coil turns representing wires extending/running along the central aperture 305. For example, the top coil 304*a*, the bottom coil 304*b*, the left coil 302*b*, and the right coil 302*a* may include 96 turns, such that the vertical field trapezoidal coil 304 and the horizontal field trapezoidal coil 302 may include two set of coils with 96 turns each.

With continued reference to FIG. 3A, the coil lengths and other physical features of the coils of the 2D scanning magnet 300 also provide advantageous results that balance magnetic field uniformity and field strength. For example, the 2D scanning magnet 300 may be made with square copper wire that is approximately 10 millimeters by 10 millimeters in dimension, or the 2D scanning magnet 300 may utilize thinner wires that are, for example, 5 millimeters square. Such thick square copper wires utilized for the 2D scanning magnet 300 coils 302, 304 may be chosen in order to reduce the overall current density through the 2D scanning magnet 300 and current losses if direct current is used to drive the 2D scanning magnet 300. In some aspects, the coil wires may be round and/or any other suitable geometry, and the coil wires may be any suitable dimension.

Moreover, in certain instances, the copper wire chosen to construct the 2D scanning magnet 300 may also include cooling wire holes drilled through the center of the 10 or 5 millimeter square wire to enable more efficient cooling of the 2D scanning magnet 300 during operation. These wire holes may be, for example, 3 millimeter or 5 millimeter circular wire holes located in the center of the coil wires allowing water to pass through the holes thereby cooling the 2D scanning magnet 300. As a result, the wire holes may enable the 2D scanning magnet 300 to operate consistently for multiple minutes (e.g., 3 minutes or longer, as required to treat a patient) without requiring additional cooling. When an individual patient’s scanning procedure is complete, the 2D scanning magnet 300 may stop operation (e.g., turn-off, reset) prior to resuming operation to treat a subsequent patient. In this manner, the 3 millimeter wire holes may increase the reliability of the 2D scanning magnet 300 by lengthening the effective operating time of the magnet 300. Of course, it should be understood that any suitable cooling mechanism may be utilized, such as air cooling, in order to regulate the operating temperature of the 2D scanning magnet 300. Moreover, as previously mentioned, the wires may be round and/or any other suitable geometry, such that the wire holes are drilled through the round wire and/or the wire of any suitable geometry.

Figure 3B:
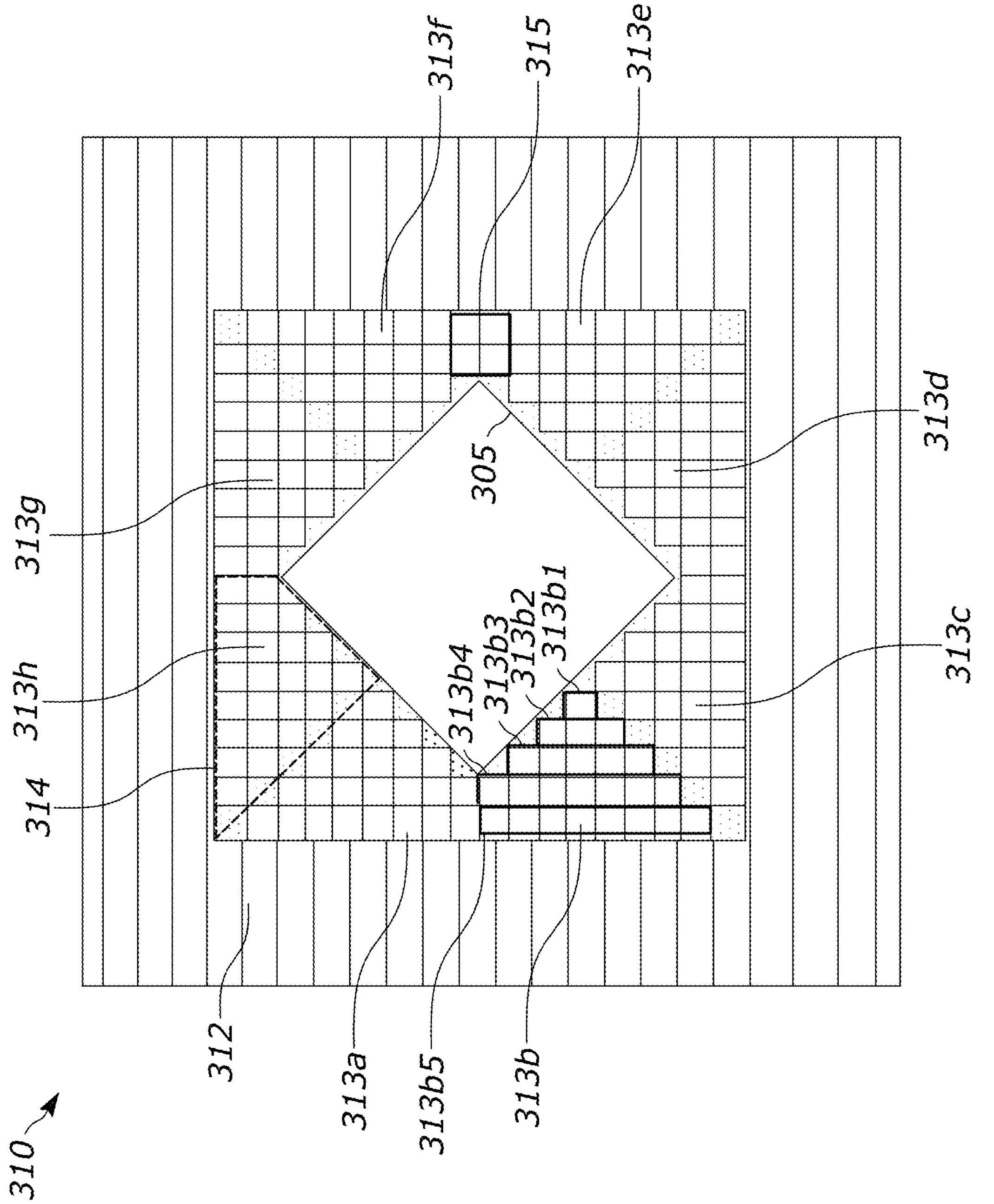
FIG. 3B is a cross-sectional view of an example 2D scanning magnet with an iron yoke, in accordance with some embodiments.

In any event, to provide a better understanding of the coil turns and coil layers, FIG. 3B is a cross-sectional view of an example 2D scanning magnet 310 with an iron yoke 312, in accordance with some embodiments. For ease of discussion, the coils of the example 2D scanning magnet 310 may include fewer layers and turns than the 2D scanning magnet 300 illustrated in FIG. 3A. Namely, the coils of the example 2D scanning magnet 310 may include five layers and 24 turns.

As illustrated in FIG. 3B, the 2D scanning magnet 310 includes a first set of coil turns 313*a*, a second set of coil turns 313*b*, a third set of coil turns 313*c*, a fourth set of coil turns 313*d*, a fifth set of coil turns 313*e*, a sixth set of coil turns 313*f*, a seventh set of coil turns 313*g*, and an eighth set of coil turns 313*h*. Generally speaking, the first set of coil turns 313*a* and the sixth set of coil turns 313*f* may correspond to the top coil 304*a*, the second set of coil turns 313*b* and the fifth set of coil turns 313*e* may correspond to the bottom coil 304*b*, the third set of coil turns 313*c* and the eighth set of coil turns 313*h* may correspond to the left coil 302*b*, and the fourth set of coil turns 313*d* and the seventh set of coil turns 313*g* may correspond to the right coil 302*a*.

As an example, the eighth set of coil turns 313*h* may be grouped in accordance with a trapezoid profile 314. As illustrated in FIG. 3B, the trapezoid profile 314 may represent the cross-sectional profile of each individual set of coil turns 313*a-h*. The eighth set of coil turns 313*h* included within the trapezoid profile 314 may include 24 turns, as represented by the 24 squares located within the trapezoid profile 314. Each of the 24 squares located within the trapezoid profile 314 may represent a wire extending/running along the central aperture 305.

The 2D scanning magnet 310 may also include five layers, as illustrated by the layers 313*b*1, 313*b*2, 313*b*3, 313*b*4, and 313*b*5 of the second set of coil turns 313*b*. Each layer 313*b*1-5 may include a different number of wires extending along the central aperture 305. For example, the first layer 313*b*1 may include a single wire extending along the central aperture 305, while the fifth layer 313*b*5 may include eight wires extending along the central aperture 305. In this example, the first layer 313*b*1 may be an outermost layer of the corresponding coil (e.g., an outermost layer of the bottom coil 304*b* of FIG. 3A), and the fifth layer 313*b*5 may be an innermost layer of the corresponding coil (e.g., an innermost layer of the bottom coil 304*b*).

Moreover, as previously mentioned, each of the layers 313*b*1-5 may include a progressively increasing number of wires, such that the first layer 313*b*1 includes the fewest wires extending along the central aperture 305 (i.e., a single wire), and the fifth layer 313*b*5 includes the most wires extending along the central aperture 305 (i.e., eight wires). The fifth layer 313*b*5 may also be the only layer that is asymmetric relative to the first layer 313*b*1. The second layer 313*b*2, the third layer 313*b*3, and the fourth layer 313*b*4 may all include equal numbers of wires above/below the first layer 313*b*1 within the central aperture 305. However, the fifth layer 313*b*5 may include three wires extending along the central aperture 305 above the first layer 313*b*1 and four wires extending along the central aperture 305 below the first layer 313*b*1. This asymmetry may cause the upper portion of the fifth layer 313*b*5 to align (i.e., not extend beyond) with the upper half of the fourth layer 313*b*4, and may cause the meeting point between the first set of coil turns 313*a* and the second set of coil turns 313*b* to include four adjacent coil turns. For clarity, a similar meeting point 315 is illustrated between the fifth set of coil turns 313*e* and the sixth set of coil turns 313*f* that includes four adjacent coil turns.

The 2D scanning magnet 310 may also include an iron yoke 312 that encompasses the magnet 310, and the iron yoke 312 may serve to enhance the resulting magnetic field of the 2D scanning magnet 310. The iron yoke 312 may be disposed around the sets of coil turns 313*a-h* and oriented along the same axis as the sets of coil turns 313*a-h* in order to enhance the resulting magnetic field generated by the 2D scanning magnet 310. In particular, the iron yoke 312 may serve to enhance the resulting magnetic fields by approximately 25%, 50%, or higher for the sets of coil turns 313*a-h*. Additionally, the iron yoke 312 may also reduce negative field tails in the longitudinal magnetic field of the sets of coil turns 313*a-h*.

Figure 3C:
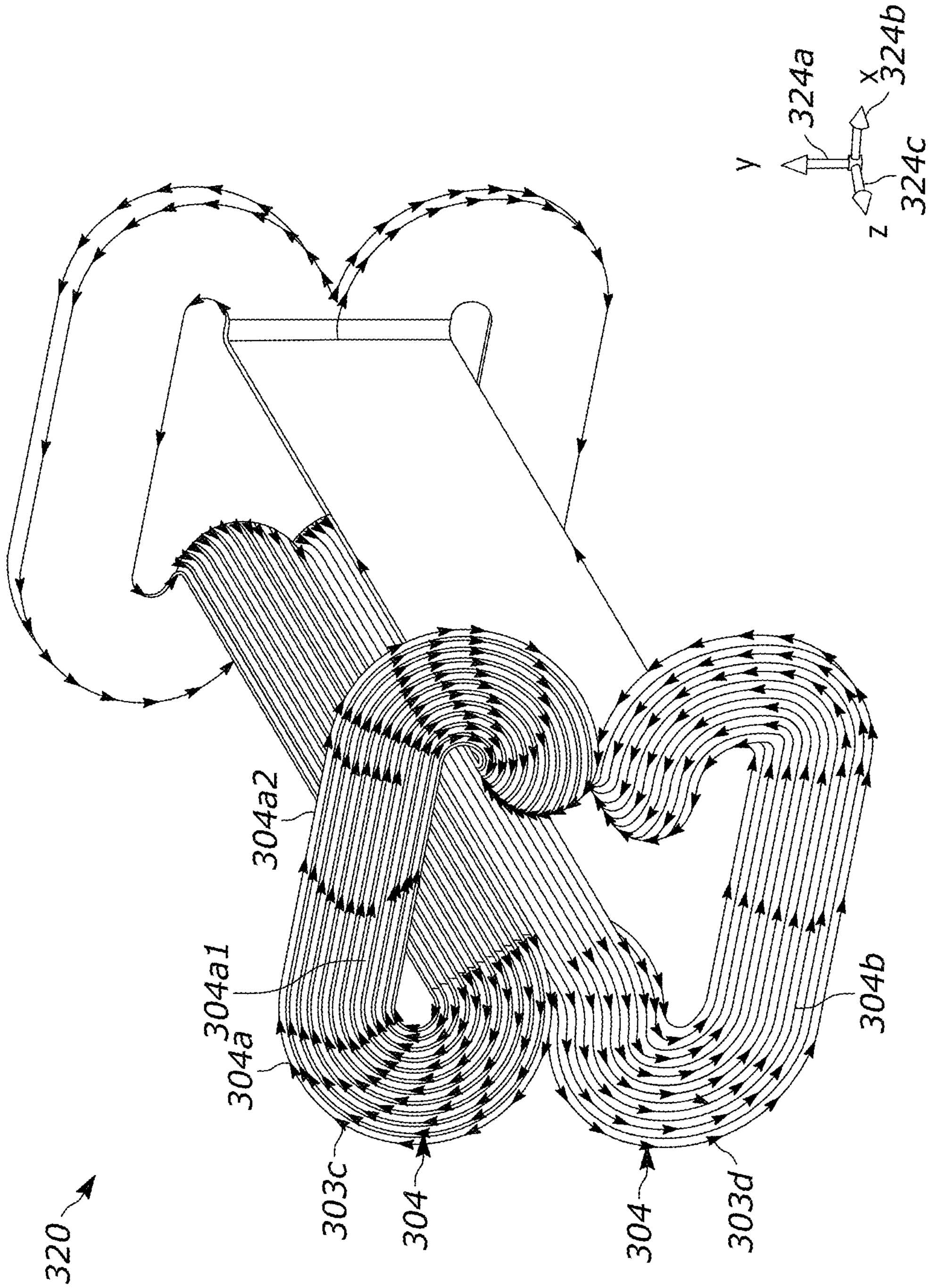
FIG. 3C is a representative three-quarter view of an example vertical field trapezoidal coil of an example 2D scanning magnet, in accordance with some embodiments.

Moreover, to provide a clearer illustration of the 2D scanning magnet 300 structure, FIG. 3C is a representative three-quarter view 320 of an example vertical field trapezoidal coil 304 of an example 2D scanning magnet (e.g., 300), in accordance with some embodiments. The example vertical field trapezoidal coil 304 includes ten coil layers extending between the outermost layer 304*a*1 and the innermost layer 304*a*2. The representative three-quarter view 320 also includes three axes, a first axis 324*a*, a second axis 324*b*, and a third axis 324*c*. For ease of discussion, the first axis 324*a* may be the Y axis (e.g., Y axis 306*b*), the second axis 324*b* may be the X axis (e.g., X axis 306*a*), the third axis 324*c* may be the Z axis (e.g., Z axis 306*c*).

As illustrated in FIG. 3C, the example vertical field trapezoidal coil 304 is oriented along the Z axis 324*c*, such that an ion beam transmitting through the center of the vertical field trapezoidal coil 304 may transmit in a direction parallel to the Z axis 324*c*. When an electrical current is input to the vertical field trapezoidal coil 304, the electrical current may flow through the innermost layer 304*a*2, the outermost layer 304*a*1, and all layers in between the innermost layer 304*a*2 and the outermost layer 304*a*1 in the first direction 303*c*, 303*d*.

In particular, the input electrical current may flow through each of the coil layers 304*a*1, 304*a*2, etc., in both the top coil 304*a* and the bottom coil 304*b* in a continuous manner. For example, the input electrical current to the example vertical field trapezoidal coil 304 may initially be received at an input lead where the input electrical current may flow through the outermost layer 304*a*1. Thereafter, the input electrical current may flow from the outermost layer 304*a*1 sequentially through each layer to the innermost layer 304*a*2. When the input electrical current flows through the innermost layer 304*a*2, the input electrical current may exit the top coil 304*a* through an exit lead.

In certain instances, the electrical current lead may also be included as part of the innermost layer 304*a*2, such that the electrical current may flow from the innermost layer 304*a*2 to the outermost layer 304*a*1. Thus, the input electrical current may flow from the innermost layer 304*a*2 sequentially through each layer to the outermost layer 304*a*1. In these instances, the input electrical current may flow through the outermost layer 304*a*1, and the input electrical current may exit the top coil 304*a* through an exit lead included as part of the outermost layer 304*a*1. Of course, it should be understood that the electrical current may flow through the top coil 304*a* or the bottom coil 304*b* to other of the top coil 304*a* or the bottom coil 304*b*, and/or the electrical current may be identical through both the top coil 304*a* and the bottom coil 304*b*.

Additionally, each layer of the example vertical field trapezoidal coil 304 may include a different number of turns. For example, the outermost layer 304*a*1 may be a single wire conformed to the shape of the top coil 304*a*. The innermost layer 304*a*2 may have seventeen wires stacked on top of one another and displaced behind (e.g., in a direction antiparallel to the Z axis 324*c*) the outermost layer 304*a*1. More specifically, the innermost layer 304*a*2 may have seven wires extending above the outermost layer 304*a*1 (e.g., in the direction of the Y axis 324*a*), one wire in the same vertical position as the outermost layer 304*a*1, and nine wires extending below the outermost layer 304*a*1 (e.g., in the antiparallel direction of the Y axis 324*a*).

Figure 3D:
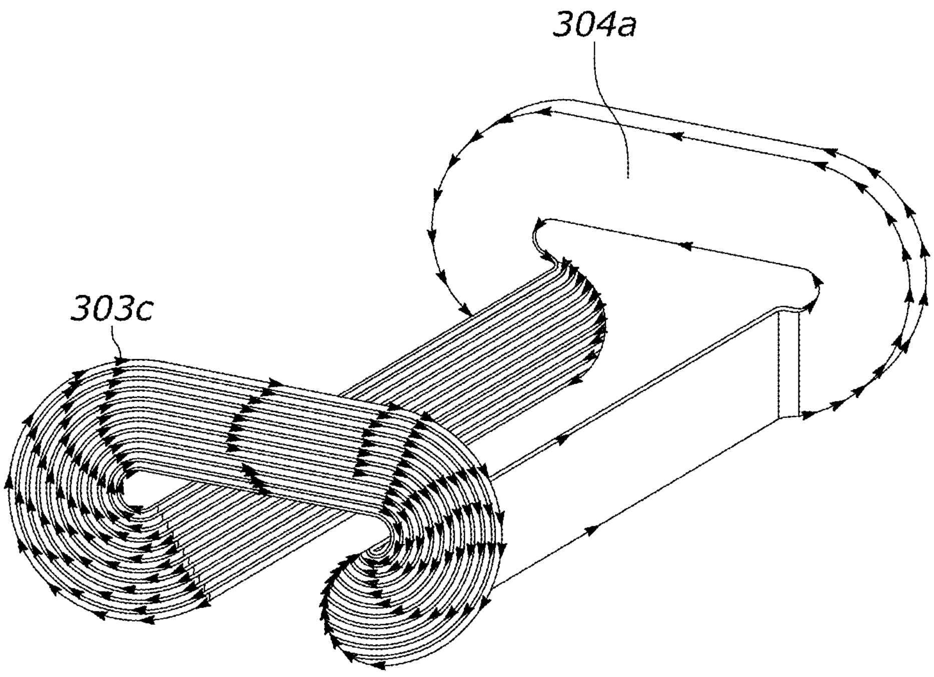
FIGS. 3D and 3E are representative of top and bottom coils of the example vertical field trapezoidal coil of FIG. 3C, in accordance with some embodiments.
Figure 3E:
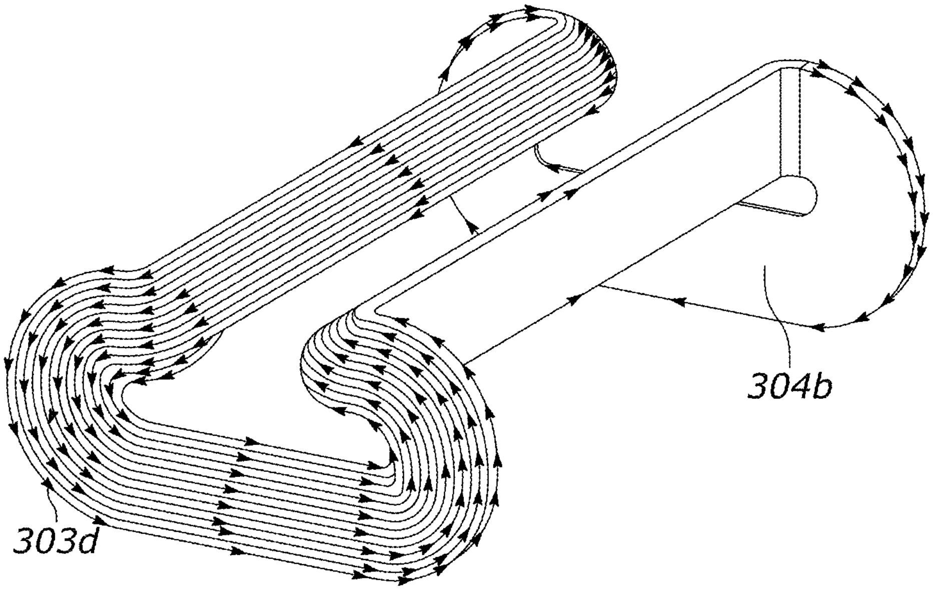

FIGS. 3D and 3E are each representative of individual coils of the example vertical field trapezoidal coil 304 of FIG. 3C, and in accordance with some embodiments. In particular, the top coil 304*a* is illustrated in FIG. 3D, and the bottom coil 304*b* is illustrated in FIG. 3E. As previously mentioned, both of these coils 304*a*, 304*b* may include multiple coil layers. These coil layers may be created by, for example, fabricating individual layers of coils that are stacked on top of one another, and arranging the coil layers together in a manner that creates the top/bottom coils 304_a_, 304_b_. In these instances, the electrical current may flow through each of the coil layers simultaneously, as each coil layer may have an independent electrical input/output. Alternatively, the coil layers may be a single continuous wire that is fabricated into the shape of the top/bottom coils 304_a_, 304_b_. In these instances, the electrical current may flow through each of the coil layers continuously, as the entire coil 304_a_, 304_b_ may have only one electrical input/output.

Figure 3F:
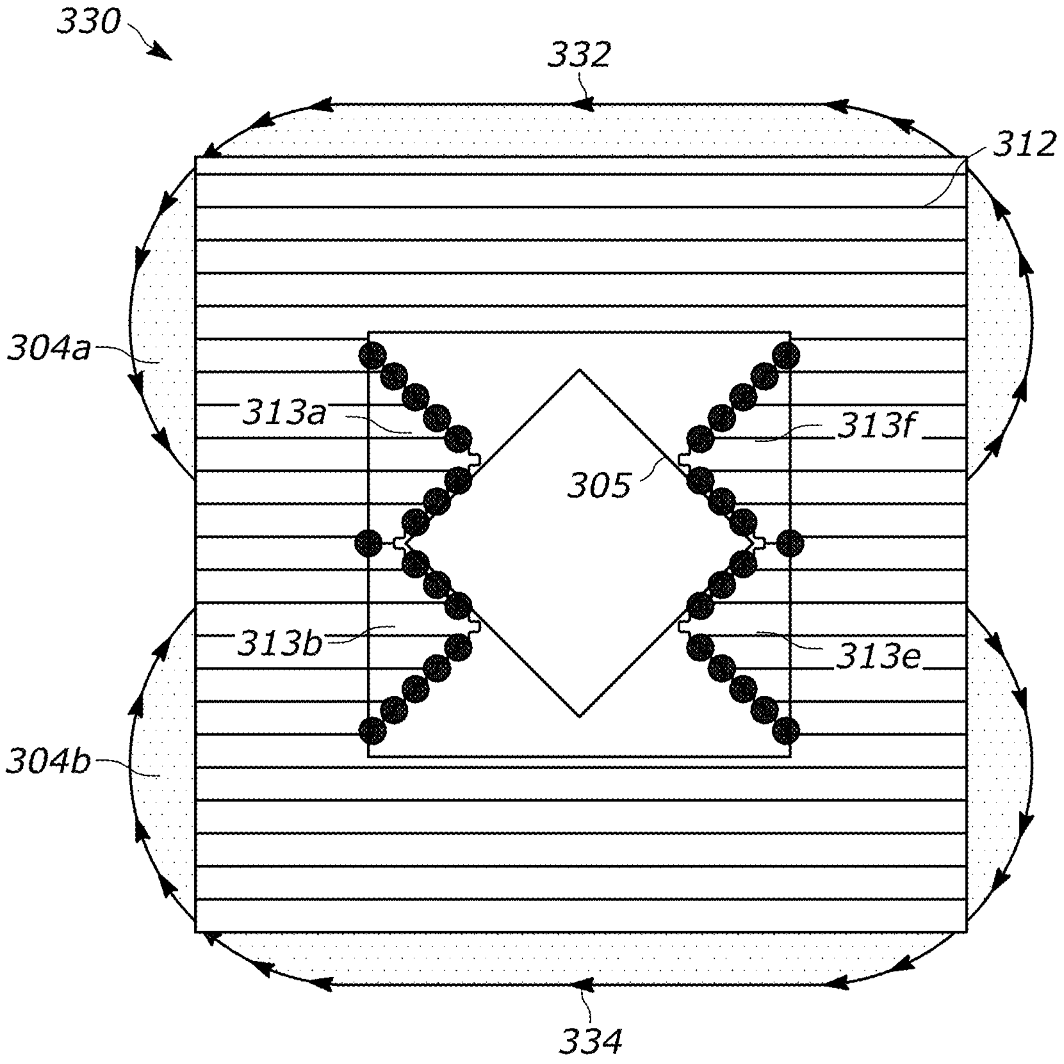
FIG. 3F is a cross-sectional view of the example vertical field trapezoidal coil of FIG. 3C with an iron yoke, in accordance with some embodiments.

FIG. 3F is a cross-sectional view 330 of the example vertical field trapezoidal coil 304 of FIG. 3C with an iron yoke 312, in accordance with some embodiments. The cross-sectional view 330 generally represents the configuration of the example vertical field trapezoidal coil 304 as viewed along the Z axis 324_c_ of FIG. 3C.

As illustrated in FIG. 3F, the cross-sectional view 330 includes representations of the top coil 304_a_ and the bottom coil 304_b_ extending beyond the iron yoke 312, as well as the turns of the top and bottom coils 304_a_, 304_b_. Namely, the cross-sectional view 330 includes representations of the first set of coil turns 313_a_, the second set of coil turns 313_b_, the fifth set of coil turns 313_e_, and the sixth set of coil turns 313_f_. As indicated by the current arrows 332, 334, the input current may flow through the fifth set of coil turns 313_e_ and the sixth set of coil turns 313_f_ in a first direction (e.g., antiparallel to the Z axis 324_c_), and may cycle back through the first set of coil turns 313_a_ and the second set of coil turns 313_b_ in a second direction (e.g., parallel to the Z axis 324_c_).

The input current may be varied and/or otherwise changed in the coil turns corresponding to the top and bottom coils 304_a_, 304_b_ to change the steering direction of the input ion beam along the central aperture 305. For example, the input current through the top coil 304_a_ may be reduced/increased relative to the input current through the bottom coil 304_b_. This reduction/increase of input current may cause a corresponding reduction/increase in the magnetic field strength emitted by the first set of coil turns 313_a_ and the second set of coil turns 313_b_. Accordingly, the input ion beam may be steered left/right (e.g., parallel or antiparallel to the X axis 324_b_) in response to the reduction/increase of the magnetic field strength of the top coil 304_a_ relative to the bottom coil 304_b_.

Of course, it should be appreciated that the input current through the top coil 304_a_ and the bottom coil 304_b_ may generally be an identical or substantially similar current value. Moreover, variations in the input current to the top coil 304_a_ and the bottom coil 304_b_ may generally be identical or substantially similar variations to generate uniform changes to the magnetic field amplitude.

Moreover, the cross-sectional view 330 indicates the overall symmetry of the vertical field trapezoidal coil 304, resulting in symmetric magnetic fields for scanning an ion beam, and that the central aperture 305 remains unobscured by the top coil 304_a_ and the bottom coil 304_b_. As illustrated in FIG. 3F, the central aperture 305 may be approximately square with sides approximately 6 centimeters in length.

Figure 3G:
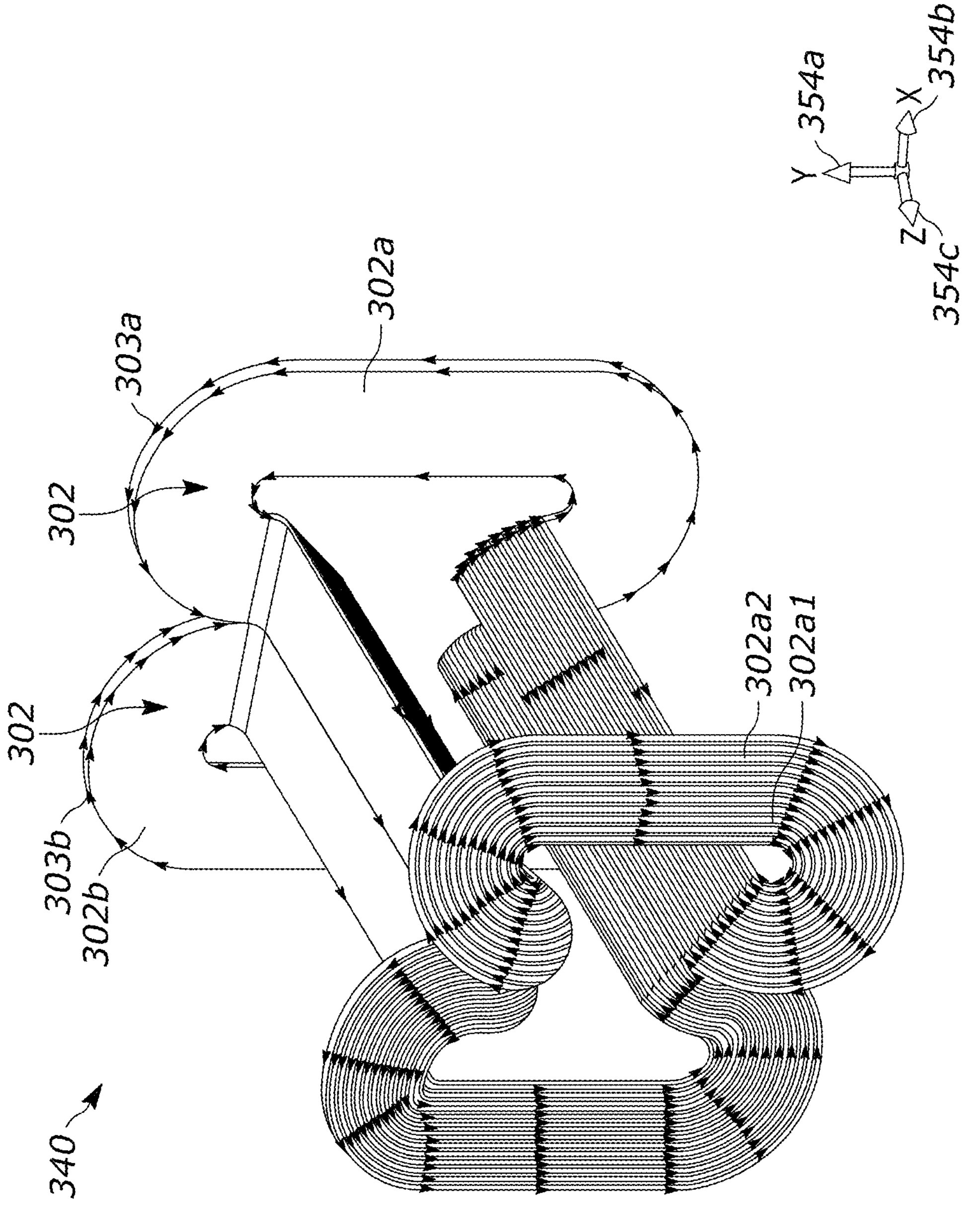
FIG. 3G is a representative three-quarter view of an example horizontal field trapezoidal coil of an example 2D scanning magnet, in accordance with some embodiments.

FIG. 3G is a representative three-quarter view 340 of the example horizontal field trapezoidal coil 302 of an example 2D scanning magnet (e.g., 300), in accordance with some embodiments. The example horizontal field trapezoidal coil 302 includes ten coil layers extending between the outermost layer 302_a_1 and the innermost layer 302_a_2. The representative three-quarter view 340 also includes three axes, a first axis 354_a_, a second axis 354_b_, and a third axis 354_c_. For ease of discussion, the first axis 354_a_ may be the Y axis (e.g., Y axis 306_b_), the second axis 354_b_ may be the X axis (e.g., X axis 306_a_), the third axis 354_c_ may be the Z axis (e.g., Z axis 306_c_).

As illustrated in FIG. 3G, the example horizontal field trapezoidal coil 302 is oriented along the Z axis 354_c_, such that an ion beam transmitting through the center of the horizontal field trapezoidal coil 302 may transmit in a direction parallel to the Z axis 354_c_. When an electrical current is input to the horizontal field trapezoidal coil 302, the electrical current may flow through the innermost layer 302_a_2, the outermost layer 302_a_1, and all layers in between the innermost layer 302_a_2 and the outermost layer 302_a_1 in the first direction 303_a_, 303_b_.

In particular, the input electrical current may flow through each of the coil layers 302_a_1, 302_a_2, etc., in both the right coil 302_a_ and the left coil 302_b_ in a continuous manner. For example, the input electrical current to the example horizontal field trapezoidal coil 302 may initially be received at an input lead of the right coil 302_a_ where the input electrical current may flow through the outermost layer 302_a_1. Thereafter, the input electrical current may flow from the outermost layer 302_a_1 sequentially through each layer to the innermost layer 302_a_2. When the input electrical current flows through the innermost layer 302_a_2, the input electrical current may exit the right coil 302_a_ through an exit lead.

In certain instances, the electrical current lead may also be included as part of the innermost layer 302_a_2, such that the electrical current may flow from the innermost layer 302_a_2 to the outermost layer 302_a_1. Thus, the input electrical current may flow from the innermost layer 302_a_2 sequentially through each layer to the outermost layer 302_a_1. In these instances, the input electrical current may flow through the outermost layer 302_a_1, and the input electrical current may exit the right coil 302_a_ through an exit lead included as part of the outermost layer 302_a_1. Of course, it should be understood that the electrical current may flow through the left coil 304_b_ or the right coil 302_a_ to other of the left coil 302_b_ or the right coil 302_a_, and/or the electrical current may be identical through both the left coil 302_b_ and the right coil 302_a_.

Additionally, each layer of the example horizontal field trapezoidal coil 302 may include a different number of turns. For example, the outermost layer 302_a_1 may be a single wire conformed to the shape of the right coil 302_a_. The innermost layer 302_a_2 may have seventeen wires stacked on top of one another and displaced behind (e.g., in a direction antiparallel to the Z axis 354_c_) the outermost layer 302_a_1. More specifically, the innermost layer 302_a_2 may have seven wires extending to the right of the outermost layer 302_a_1 (e.g., in the direction of the X axis 354_b_), one wire in the same horizontal position as the outermost layer 302_a_1, and nine wires extending to the left of the outermost layer 302_a_1 (e.g., in the antiparallel direction of the X axis 354_b_).

Figure 3I:
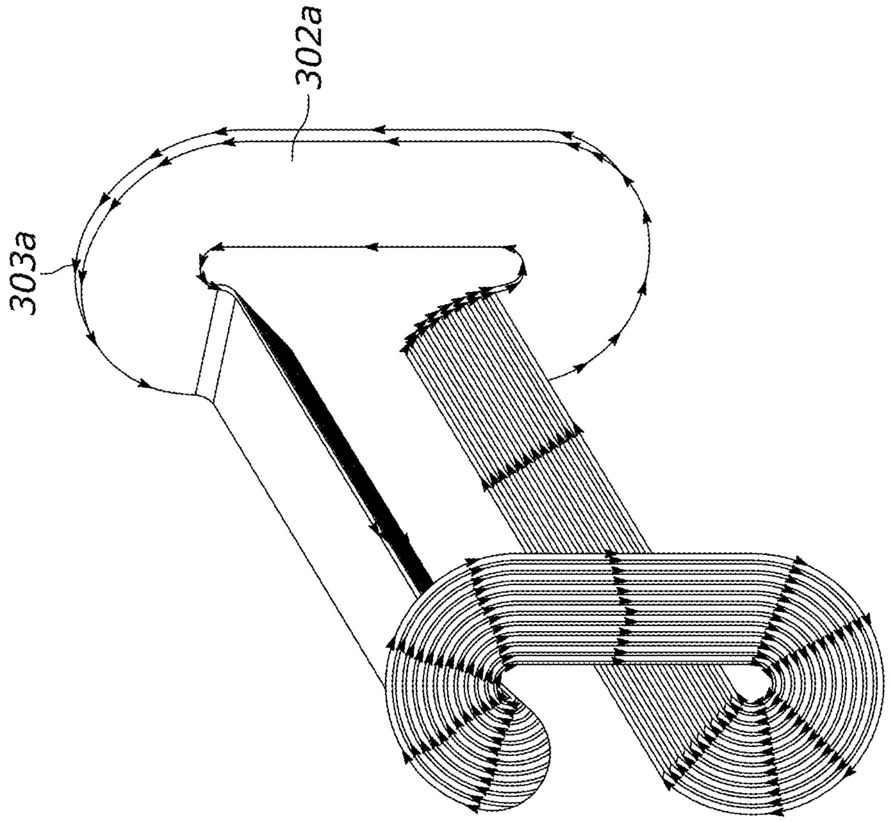
FIGS. 3H and 3I are representative of left and right coils of the example horizontal field trapezoidal coil of FIG. 3G, in accordance with some embodiments.
Figure 3H:
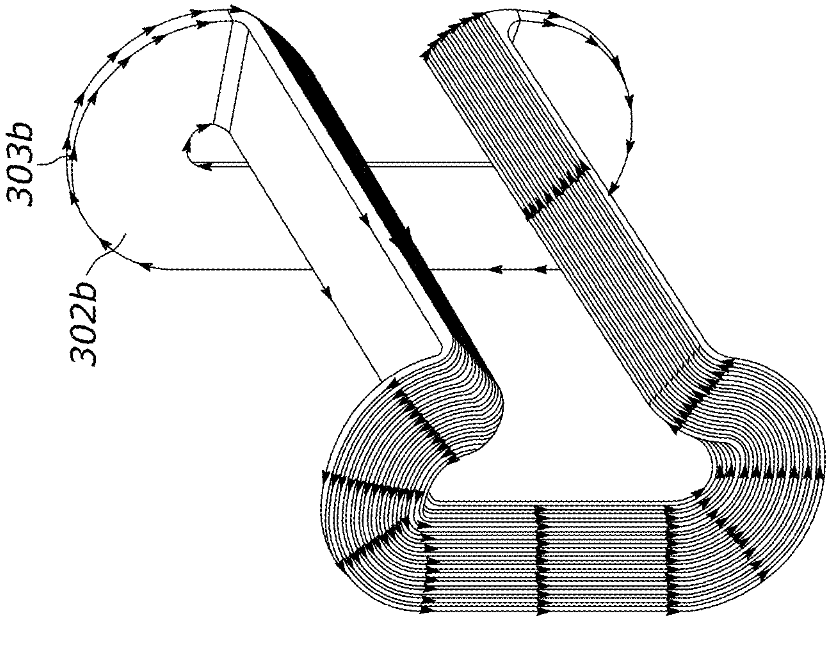

FIGS. 3H and 3I are each representative of individual coils of the example horizontal field trapezoidal coil 302 of FIG. 3G, and in accordance with some embodiments. In particular, the left coil 302_b_ is illustrated in FIG. 3H, and the right coil 302_a_ is illustrated in FIG. 3I. As previously mentioned, both of these coils 302_a_, 302_b_ may include multiple coil layers. These coil layers may be created by, for example, fabricating individual layers of coils that are stacked on top of one another, and arranging the coil layers together in a manner that creates the left/right coils 302_a_, 302_b_. In these instances, the electrical current may flow through each of the coil layers simultaneously, as each coil layer may have an independent electrical input/output. Alternatively, the coil layers may be a single continuous wire that is fabricated into the shape of the left/right coils 302*a*, 302*b*. In these instances, the electrical current may flow through each of the coil layers continuously, as the entire coil 302*a*, 302*b* may have only one electrical input/output.

Figure 3J:
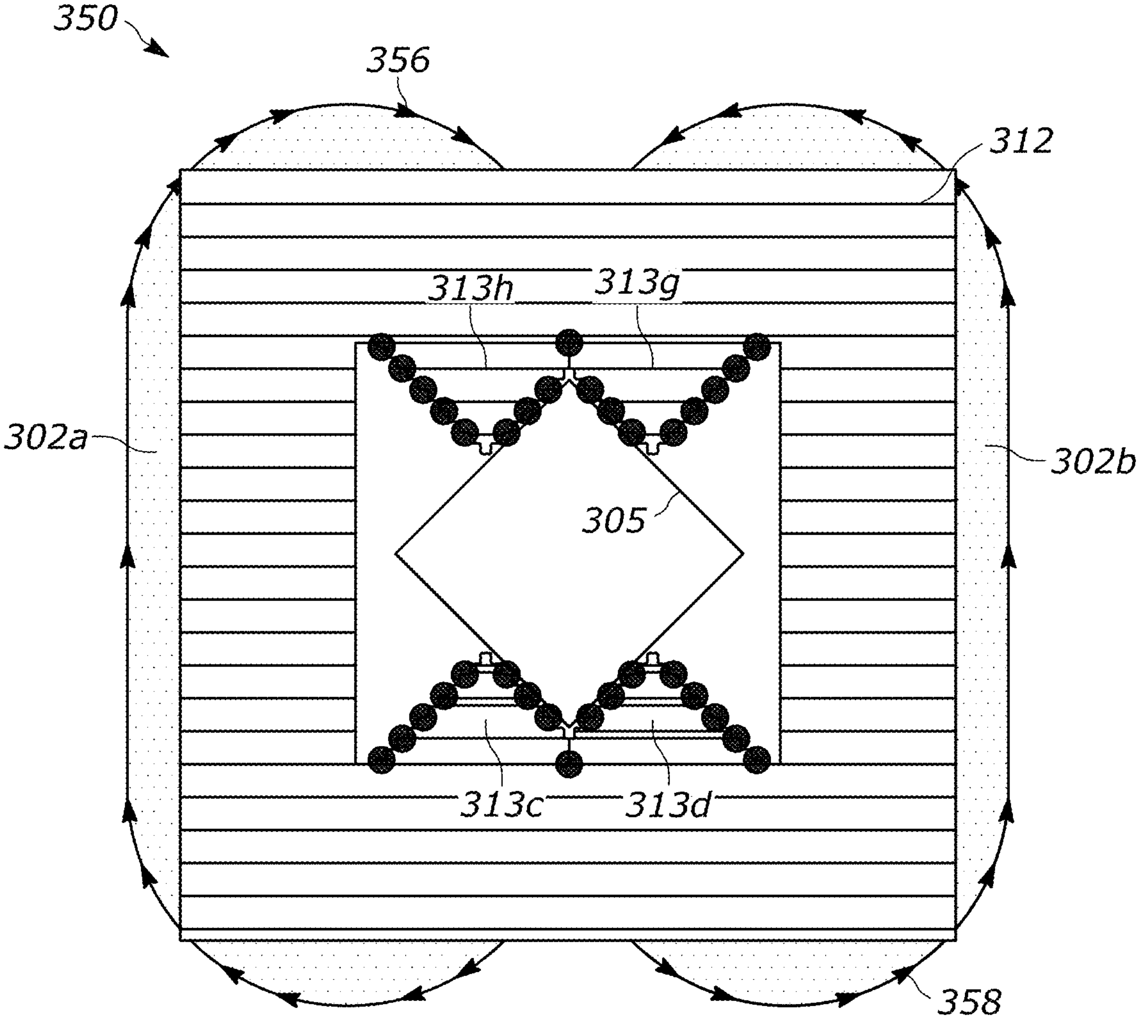
FIG. 3J is a cross-sectional view of the example horizontal field trapezoidal coil of FIG. 3G with an iron yoke, in accordance with some embodiments.

FIG. 3J is a cross-sectional view 350 of the example horizontal field trapezoidal coil 302 of FIG. 3G with an iron yoke 312, in accordance with some embodiments. The cross-sectional view 350 generally represents the configuration of the example horizontal field trapezoidal coil 302 as viewed along the Z axis 354*c* of FIG. 3G.

As illustrated in FIG. 3J, the cross-sectional view 350 includes representations of the left coil 302*b* and the right coil 302*a* extending beyond the iron yoke 312, as well as the turns of the left and right coils 302*a*, 302*b*. Namely, the cross-sectional view 350 includes representations of the third set of coil turns 313*c*, the fourth set of coil turns 313*d*, the seventh set of coil turns 313*g*, and the eighth set of coil turns 313*h*. As indicated by the current arrows 356, 358, the input current may flow through the third set of coil turns 313*c* and the fourth set of coil turns 313*d* in a first direction (e.g., antiparallel to the Z axis 354*c*), and may cycle back through the seventh set of coil turns 313*g* and the eighth set of coil turns 313*h* in a second direction (e.g., parallel to the Z axis 354*c*).

The input current may be varied and/or otherwise changed in the coil turns corresponding to the left and right coils 302*a*, 302*b* to change the steering direction of the input ion beam along the central aperture 305. For example, the input current through the left coil 302*b* may be reduced/increased relative to the input current through the right coil 302*a*. This reduction/increase of input current may cause a corresponding reduction/increase in the magnetic field strength emitted by the third set of coil turns 313*c* and the eighth set of coil turns 313*h*. Accordingly, the input ion beam may be steered upward/downward (e.g., parallel or antiparallel to the Y axis 354*a*) in response to the reduction/increase of the magnetic field strength of the left coil 302*b* relative to the right coil 302*a*.

Of course, it should be appreciated that the input current through the left coil 302*b* and the right coil 302*a* may generally be an identical or substantially similar current value. Moreover, variations in the input current to the left coil 302*b* and the right coil 302*a* may generally be identical or substantially similar variations to generate uniform changes to the magnetic field amplitude.

Moreover, the cross-sectional view 350 indicates the overall symmetry of the horizontal field trapezoidal coil 302, resulting in symmetric magnetic fields for scanning an ion beam, and that the central aperture 305 remains unobscured by the left coil 302*b* and the right coil 302*a*. As illustrated in FIG. 3J, the central aperture 305 may be approximately square with sides approximately 6 centimeters in length.

Figure 3K:
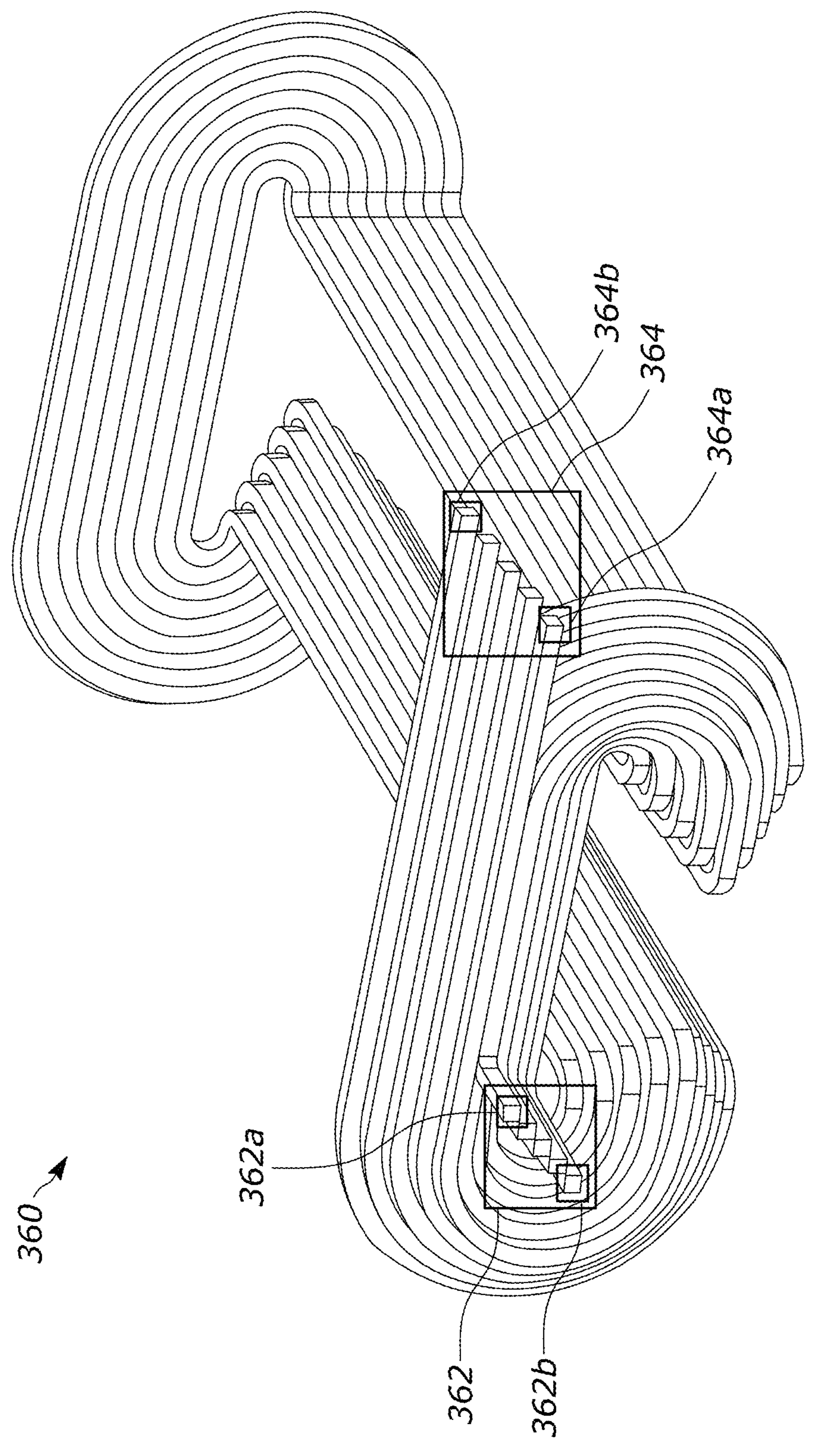
FIG. 3K is a representative perspective view of a coil that includes input/output electrical current leads for each individual coil layer, in accordance with some embodiments.

FIG. 3K is a representative perspective view of a coil 360 that includes input/output electrical current leads 362, 364 for each individual coil layer, in accordance with some embodiments. The coil 360 may be any suitable coil described herein, such as the top coil 304*a*, the bottom coil 304*b*, the left coil 302*b*, and/or the right coil 302*a*. In particular, the coil 360 includes a set of input electrical current leads 362 where electrical current may be supplied to the coil 360. The electrical current supplied to the coil 360 may flow through the coil 360 in a first direction and may flow sequentially through each turn of the respective layer until it reaches the set of output electrical current leads 364.

For example, the electrical current may enter the coil 360 at a first input electrical current lead 362*a* from the set of input electrical current leads 362. As illustrated in FIG. 3K, the first input electrical current lead 362*a* may correspond to an outermost layer that includes a single turn along the central aperture (e.g., central aperture 305). The input electrical current may flow through the outermost layer, and may exit the coil 360 through the first output electrical current lead 364*a*. Similarly, the fifth input electrical current lead 362*b* may correspond to an innermost layer that includes nine turns along the central aperture (e.g., central aperture 305). The input electrical current may flow through all nine turns of the innermost layer, and may exit the coil 360 through the fifth output electrical current lead 364*b*.

This configuration of the sets of input/output electrical current leads 362, 364 for each individual coil layer thus enables fine tuning of the magnetic fields emitted by the coil 360. Namely, a user may adjust the input current through the input electrical current lead for any layer of the coil 360, and may thereby adjust the magnetic field emitted by any of the layers of the coil 360. For example, the user may adjust the input current through the fifth input electrical current lead 362*b*, and may accordingly adjust the magnetic field emitted by the entire innermost layer. The user may also adjust the input electrical current through the first input electrical current lead 362*a*, and may accordingly adjust the magnetic field emitted by the entire outermost layer.

Figure 3L:
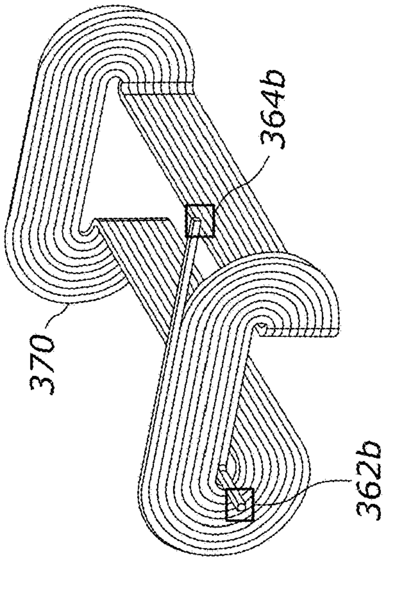
FIGS. 3L-3Q are representative perspective views of the individual coil layers that comprise the coil of FIG. 3K, in accordance with some embodiments.

The individual input/output electrical current lead configuration illustrated in FIG. 3K is further illustrated in FIGS. 3L-3Q. In particular, FIGS. 3L-3Q are representative perspective views of the individual coil layers that comprise the coil 360 of FIG. 3K, in accordance with some embodiments. FIG. 3L illustrates an innermost layer 370 that has the fifth input electrical current lead 362*b* and the second output electrical current lead 364*b*. As illustrated in FIG. 3K, the input electrical current may flow from the fifth input electrical current lead 362*b* through each of the nine turns of the innermost layer 370. The input electrical current may then reach the second output electrical current lead 364*b*, where the input electrical current may exit the innermost layer 370.

Figure 3M:
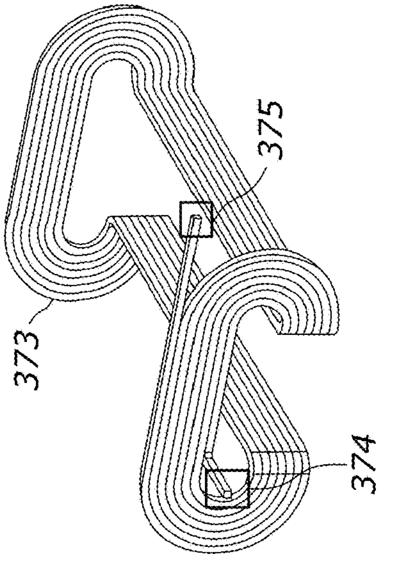

FIG. 3M illustrates a fourth layer 373 that has a fourth input electrical current lead 374 and a fourth output electrical current lead 375. As illustrated in FIG. 3M, the input electrical current may flow from the fourth input electrical current lead 374 through each of the seven turns of the fourth layer 373. The input electrical current may then reach the fourth output electrical current lead 375, where the input electrical current may exit the fourth layer 373.

Figure 3N:
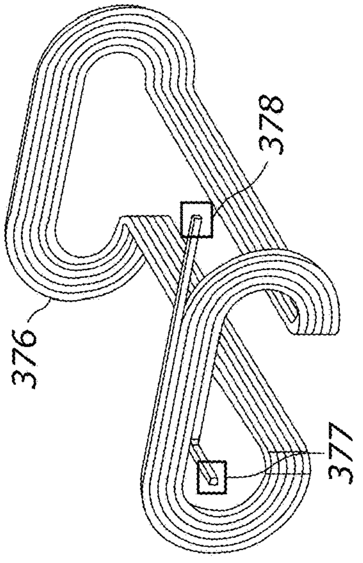

FIG. 3N illustrates a third layer 376 that has a third input electrical current lead 377 and a third output electrical current lead 378. As illustrated in FIG. 3N, the input electrical current may flow from the third input electrical current lead 377 through each of the five turns of the third layer 376. The input electrical current may then reach the third output electrical current lead 378, where the input electrical current may exit the third layer 376.

Figure 3O:
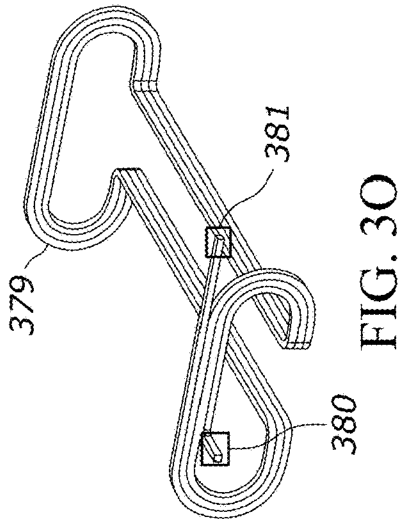

FIG. 3O illustrates a second layer 379 that has a second input electrical current lead 380 and a second output electrical current lead 381. As illustrated in FIG. 3O, the input electrical current may flow from the second input electrical current lead 380 through each of the three turns of the second layer 379. The input electrical current may then reach the second output electrical current lead 381, where the input electrical current may exit the second layer 379.

Figure 3P:
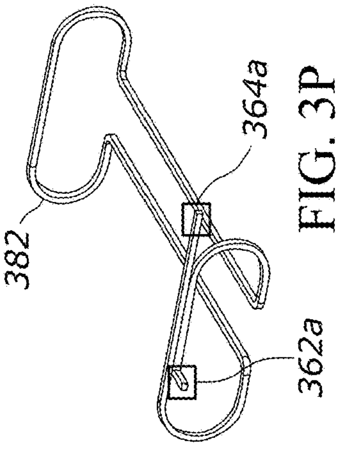

FIG. 3P illustrates an outermost layer 382 that has the first input electrical current lead 362*a* and the first output electrical current lead 364*a*. As illustrated in FIG. 3P, the input electrical current may flow from the first input electrical current lead 362*a* through the single turn of the outermost layer 382. The input electrical current may then reach the first output electrical current lead 364*a*, where the input electrical current may exit the outermost layer 382.

Figure 3Q:
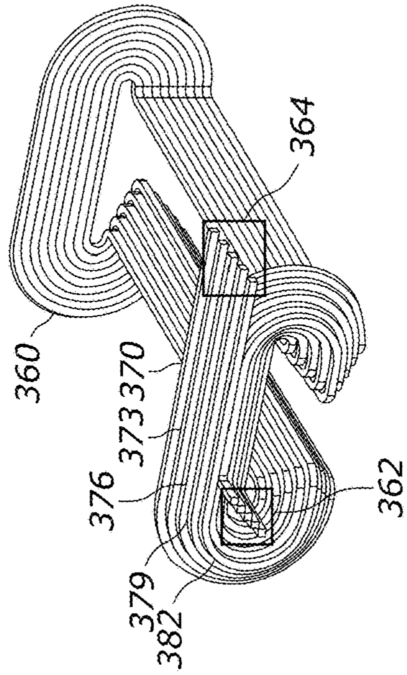

FIG. 3Q illustrates the coil 360 of FIG. 3K that is comprised of the innermost layer 370, the fourth layer 373, the third layer 376, the second layer 379, and the outermost layer 382. Each of the layers 370-382 may be individually fabricated, and may be placed next to one another in the configuration illustrated in FIG. 3Q. For example, the second layer 379 may be nested within the outermost layer 382, the third layer 376 may be nested within the second layer 379, the fourth layer 373 may be nested within the third layer 376, and the innermost layer 370 may be nested within the fourth layer 373. In this manner, the coil 360 may include a nested series of layers 370-382 that have different numbers of turns (e.g., one, three, five, etc.) and may have different input/output electrical current leads 362, 364.

However, in certain instances, the coil 360 may be fabricated in such a way that the layers 370-382 are not independent, but are a single, continuous wire shaped to form each of the layers 370-382. In these instances, the coil 360 may not have the sets of input/output electrical current leads 362, 364, but may have a single input electrical current lead and a single output electrical current lead. For example, FIG. 3R is a representative perspective view of a coil 390 that includes a single input/output electrical current lead 392, 394 for all coil layers, in accordance with some embodiments.

Figure 3R:
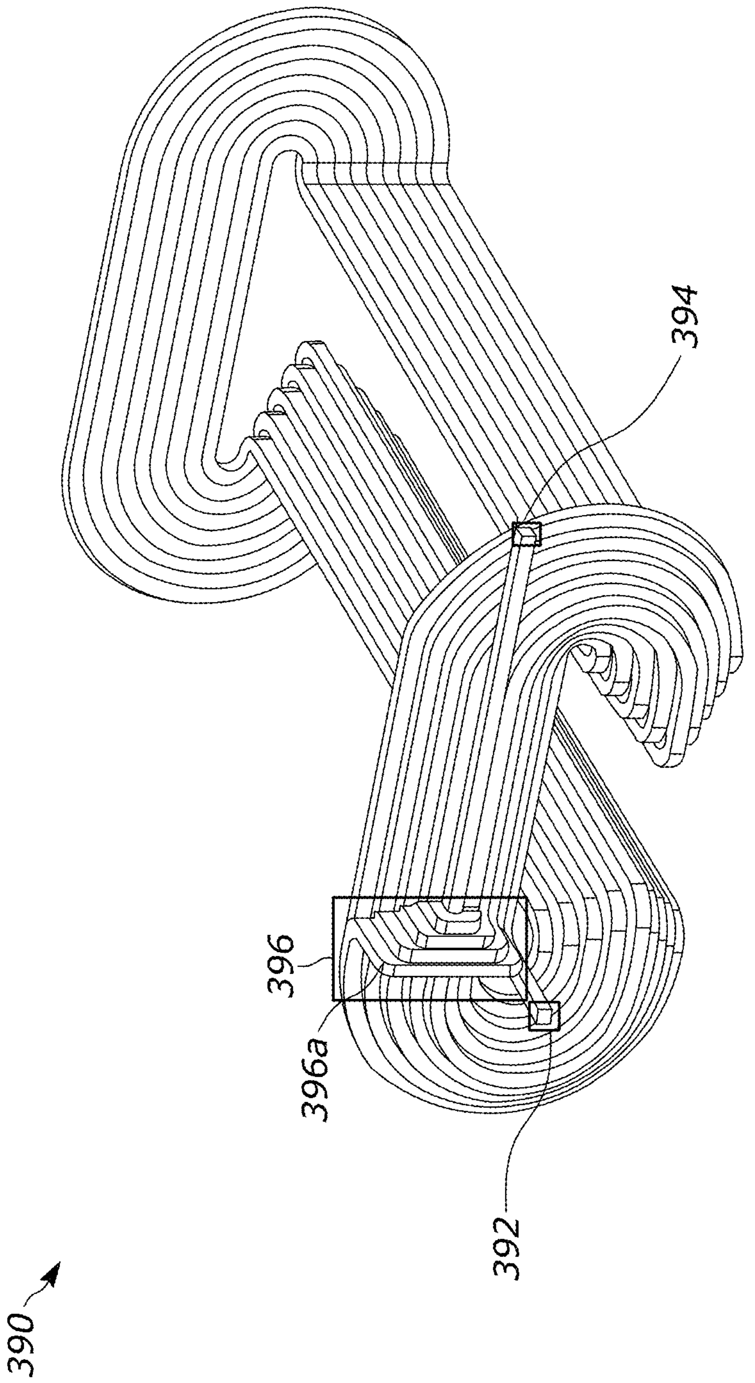
FIG. 3R is a representative perspective view of a coil that includes a single input/output electrical current lead for all coil layers, in accordance with some embodiments.

As illustrated in FIG. 3R, the coil 390 may be any suitable coil described herein, such as the top coil 304*a*, the bottom coil 304*b*, the left coil 302*b*, and/or the right coil 302*a*. In particular, the coil 390 includes an input electrical current lead 392 where electrical current may be supplied to the coil 390. The electrical current supplied to the coil 390 may flow through the coil 390 in a first direction and may flow sequentially through each turn of the coil 390 until it reaches the output electrical current lead 394. Namely, the electrical current may flow through the individual layers, and when the current has flowed through each turn of a respective layer, the current may pass through a layer transition point of the set of layer transition points 396 to transition from one layer to another layer.

For example, the electrical current may enter the coil 390 at the input electrical current lead 392, and the input electrical current lead 392 may correspond to an innermost layer (e.g., innermost layer 370) that includes nine turns along the central aperture (e.g., central aperture 305). The electrical current may thus sequentially flow through the nine turns of the innermost layer, the seven turns of the fourth layer, the five turns of the third layer, the three turns of the second layer, and the single turn of the outermost layer. Accordingly, the input electrical current may flow from the input electrical current lead 392 through the coil 390, and may finally exit the coil 390 through the output electrical current lead 394 corresponding to the outermost layer (e.g., outermost layer 382).

More specifically, the input electrical current may flow through the input electrical current lead 392 corresponding to an innermost layer (e.g., innermost layer 370) that includes nine turns along the central aperture (e.g., central aperture 305). The input electrical current may flow through each of the nine turns of the innermost layer, and may reach the set of layer transition points 396. The input electrical current may then flow through the first layer transition point 396*a* to transition from the innermost layer to a fourth layer (e.g., fourth layer 373). The input electrical current may thereafter flow through each subsequent layer utilizing the set of layer transition points 396 until the input electrical current flows through the single turn of the outermost layer and exits the coil 390 through the output electrical current lead 394.

This configuration of the single input/output electrical current leads 392, 394 for all coil layers enables highly responsive tuning of the magnetic field emitted by the coil 390. Namely, a user may adjust the input current through the input electrical current lead 392 of the coil 390, and may thereby adjust the magnetic field emitted by all of the layers of the coil 390.

Regardless, and as a result of the design features of the 2D scanning magnet 300 described herein in reference to FIGS. 3A-3R, the 2D scanning magnets of the present disclosure overcome the issues experienced by conventional scanning magnets (e.g., prior art scanning magnet 200). Specifically, as a consequence of the designs of the horizontal field trapezoidal coil 302 (e.g., right coil 302*a* and left coil 302*b*) and the vertical field trapezoidal coil 304 (e.g., top coil 304*a* and bottom coil 304*b*), the magnetic fields generated by both coils 302, 304 are uniform in both directions in which the ion beam is scanned by the 2D scanning magnet 300. To illustrate this uniformity, FIG. 4A is an example graph 400 illustrating horizontal and vertical magnetic field components across a horizontal scanning plane generated by the example 2D scanning magnet 300 of FIG. 3A, in accordance with some embodiments.

The graph 400 may show a measure of uniformity corresponding to the respective horizontal magnetic field components and vertical magnetic field components of the trapezoidal coils of the 2D scanning magnet 300 plotted as a function of the lateral position within the central aperture 305 of the 2D scanning magnet 300. The central aperture 305 may generally have a width of approximately 6 centimeters, such that the lateral center of the central aperture 305 is designated by 0 on the x-axis, and the +/−3 centimeter values on the x-axis may approximately represent the lateral extremities of the central aperture 305.

Figure 4A:
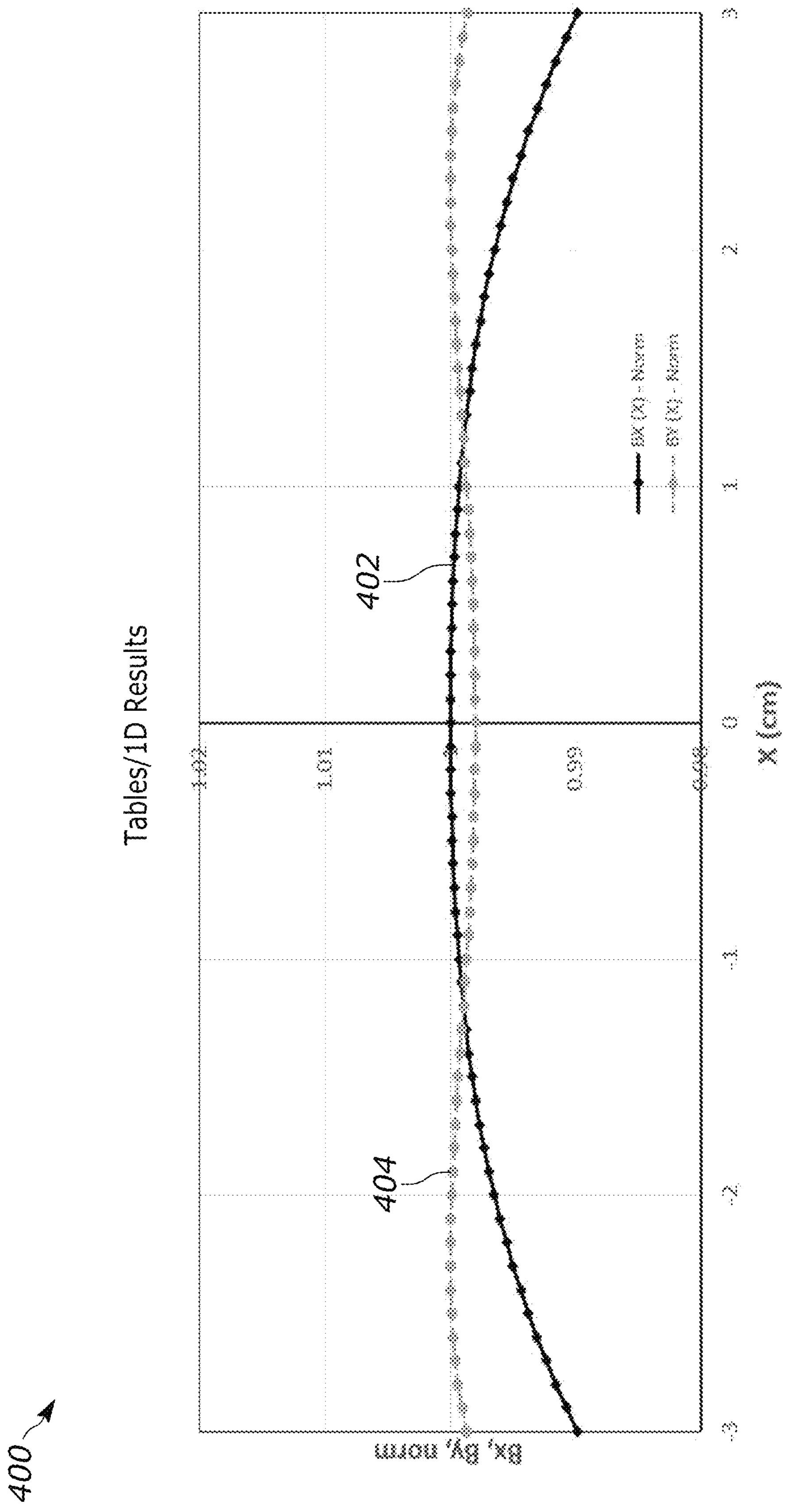
FIG. 4A is an example graph illustrating horizontal and vertical magnetic field components across a horizontal scanning plane generated by the example 2D scanning magnet of FIG. 3A, in accordance with some embodiments.

As illustrated in FIG. 4A, the 2D scanning magnet 300 may generate a magnetic field that has components in the horizontal direction (e.g., a lateral direction) and the vertical direction relative to the propagation direction of the ion beam. The uniformity of the horizontal magnetic field components generated by the 2D scanning magnet 300 across the horizontal scanning plane may be represented by the first field plot line 402, and the uniformity of the vertical magnetic field components generated by the 2D scanning magnet 300 across the horizontal scanning plane may be represented by the second field plot line 404. The graph 400 shows that the magnetic field is relatively uniform in the horizontal direction, such that the horizontal/vertical components of the magnetic field generated by the 2D scanning magnet 300 are generally within 1% of complete uniformity throughout the lateral width of the central aperture 305 of the 2D scanning magnet 300.

Similarly, the 2D scanning magnet 300 achieves high levels of uniformity in the vertical scanning direction. To illustrate this uniformity, FIG. 4B is an example graph 410 illustrating horizontal and vertical magnetic field components across a vertical scanning plane generated by the example 2D scanning magnet 300 of FIG. 3A, in accordance with some embodiments.

The graph 410 may show a measure of uniformity corresponding to the respective horizontal magnetic field components and the vertical magnetic field components of the trapezoidal coils of the 2D scanning magnet 300 plotted as a function of the vertical position within the central aperture 305 of the 2D scanning magnet 300. As previously mentioned, the central aperture 305 may generally have a width of approximately 6 centimeters, and as a result, the vertical center of the central aperture 305 is designated by 0 on the x-axis, and the +/−3 centimeter values on the x-axis may approximately represent the vertical extremities of the central aperture 305.

Figure 4B:
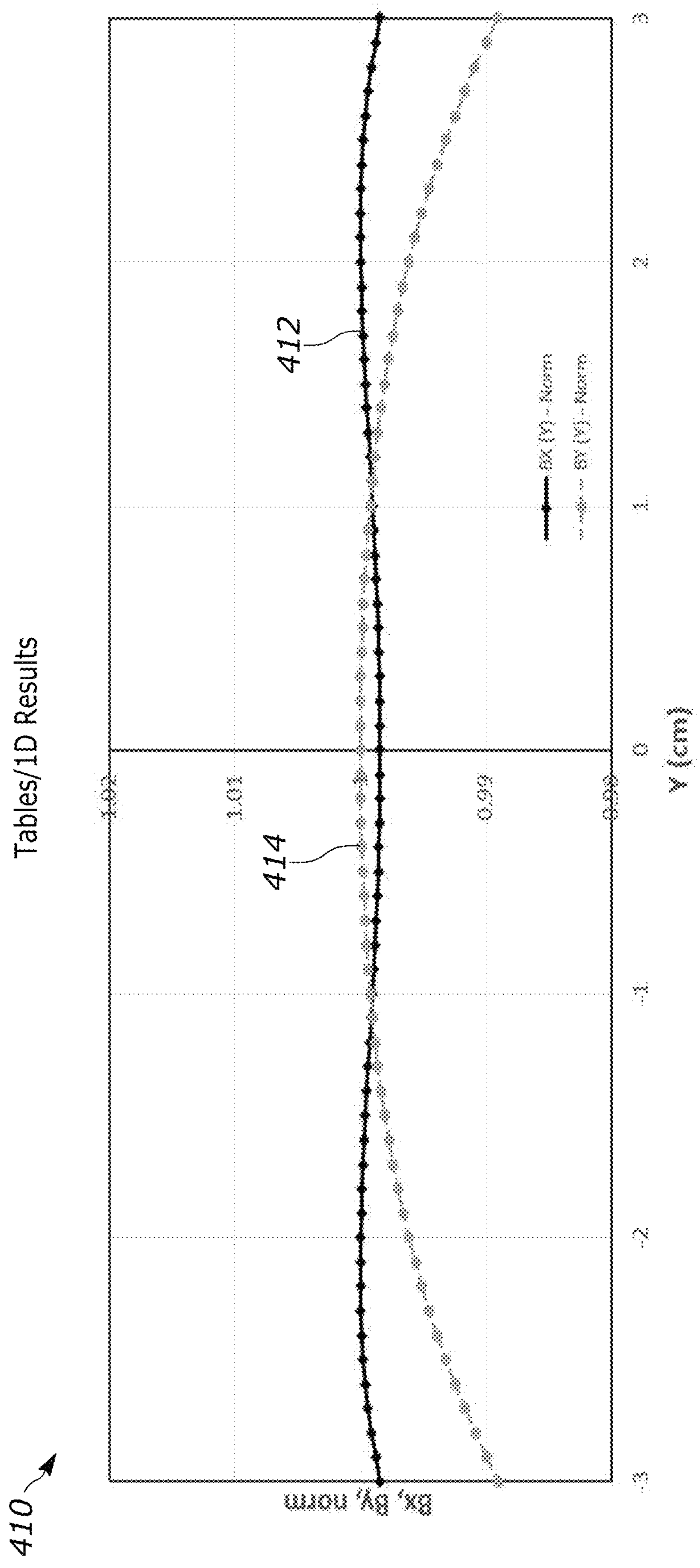
FIG. 4B is an example graph illustrating horizontal and vertical magnetic field components across a vertical scanning plane generated by the example 2D scanning magnet of FIG. 3A, in accordance with some embodiments.

As illustrated in FIG. 4B, the 2D scanning magnet 300 may generate a magnetic field that has components in the horizontal direction (e.g., a lateral direction) and the vertical direction relative to the propagation direction of the ion beam. The uniformity of the horizontal magnetic field components generated by the 2D scanning magnet 300 across the vertical scanning plane may be represented by the first field plot line 412, and the uniformity of the vertical magnetic field components generated by the 2D scanning magnet 300 across the vertical scanning plane may be represented by the second field plot line 414. The graph 410 shows that the magnetic field is relatively uniform in the vertical direction, such that the horizontal/vertical components of the magnetic field generated by the 2D scanning magnet 300 are generally within 1% of complete uniformity throughout the vertical width of the central aperture 305 of the 2D scanning magnet 300.

Accordingly, this uniformity in both scanning directions (e.g., horizontal and vertical relative to the propagation direction of the ion beam) may result in fewer inadvertent adjustments to the scanning of the ion beam, which in turn, may result in far less inadvertent damage to healthy tissue surrounding a target volume (e.g., target volume 108). Thus, the design illustrated and described herein in reference to FIGS. 3A-4B improves over conventional scanning magnet designs (e.g. prior art scanning magnet 200) by significantly minimizing the non-uniformity in ion beam scanning directions.

Figure 5:
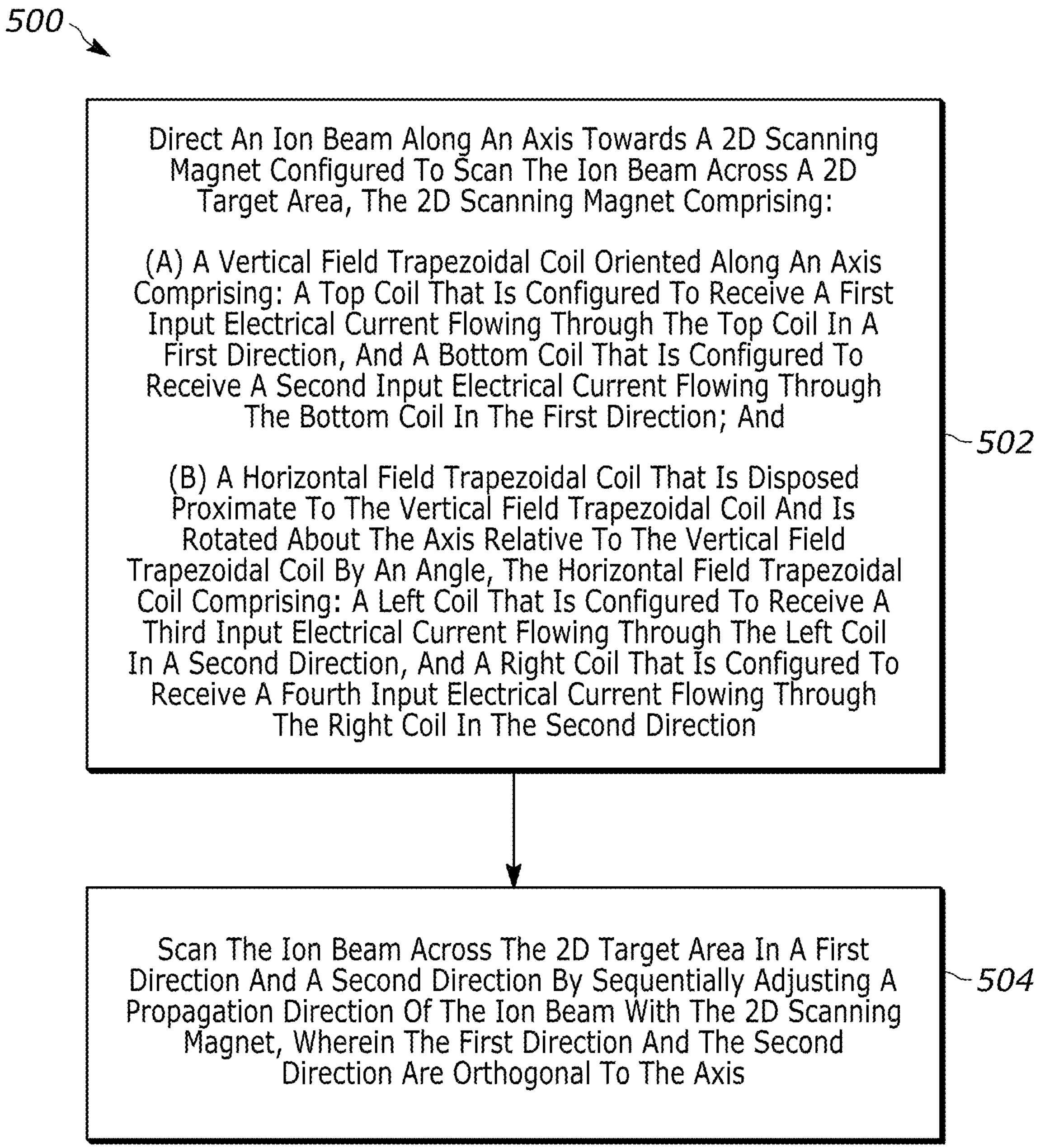
FIG. 5 is a flow diagram of an example method for scanning ion beams with a two-dimensional (2D) scanning magnet configured in accordance with the techniques of the present disclosure.

FIG. 5 is a flow diagram of an example method 500 for scanning ion beams with a two-dimensional (2D) scanning magnet configured in accordance with the techniques of the present disclosure. At block 502, the method 500 includes directing an ion beam along an axis towards a 2D scanning magnet configured to scan the ion beam across a 2D target area. The 2D scanning magnet may include: a vertical field trapezoidal coil oriented along an axis. The vertical field trapezoidal coil may include: a top coil that is configured to receive a first input electrical current flowing through the top coil in a first direction, and a bottom coil that is configured to receive a second input electrical current flowing through the bottom coil in the first direction.

The 2D scanning magnet may further include: a horizontal field trapezoidal coil that is disposed proximate to the vertical field trapezoidal coil and is rotated about the axis relative to the vertical field trapezoidal coil by an angle. The horizontal field trapezoidal coil may include: a left coil that is configured to receive a third input electrical current flowing through the left coil in a second direction, and a right coil that is configured to receive a fourth input electrical current flowing through the right coil in the second direction.

In certain embodiments, the top coil, the bottom coil, the left coil, and the right coil have a first number of coil layers at a first edge of the top coil, the bottom coil, the left coil, and the right coil; and the top coil, the bottom coil, the left coil, and the right coil have a second number of coil layers at a second edge of the top coil, the bottom coil, the left coil, and the right coil, wherein the second number of coil layers is greater than the first number of coil layers, such that the top coil, the bottom coil, the left coil, and the right coil have a trapezoidal cross section.

For example, and as illustrated in FIG. 3B, the eighth set of coil turns 313*h* corresponding to a top coil may be grouped in accordance with a trapezoid profile 314. The trapezoid profile 314 may represent the cross-sectional profile of each individual set of coil turns 313*a-h*. The eighth set of coil turns 313*h* included within the trapezoid profile 314 may include 24 turns, as represented by the 24 squares located within the trapezoid profile 314. Each of the 24 squares located within the trapezoid profile 314 may represent a wire extending/running along the central aperture 305. The right edge of the eighth set of coil turns 313*h* includes two coil layers (i.e., two coil turns at the meeting point), the left edge of the eighth set of coil turns 313*h* includes a single coil layer (i.e., one coil turn at the meeting point), and the center of the eighth set of coil turns 313*h* includes five coil layers (i.e., five coil turns). Thus, the trapezoidal profile 314 results from the asymmetry of the number of layers between the right side (two coil turns) and the left side (one coil turn) of the center of the eighth set of coil turns 313*h*.

In some embodiments, the vertical field trapezoidal coil 304 and the horizontal field trapezoidal coil 302 may be comprised of a square wire that has dimensions between 4 millimeters (mm) by 4 mm and 10 mm by 10 mm. Of course, it should be understood that the coils 302, 304 may be comprised of wire of any suitable dimensions. Further, in certain embodiments, the axis may be a first axis, and the vertical field trapezoidal coil is rotated relative to the horizontal field trapezoidal coil by an absolute value of 90 degrees relative to a respective second axis that is orthogonal to the first axis.

In some embodiments, the vertical field trapezoidal coil 304 and the horizontal field trapezoidal coil 302 may have between 20 and 100 coil turns. Moreover, in certain embodiments, the vertical field trapezoidal coil 304 may be between 60 centimeters (cm) and 80 cm in length, and the horizontal field trapezoidal coil 302 may be between 60 cm and 80 cm in length. In certain embodiments, the vertical field trapezoidal coil 304 and/or the horizontal field trapezoidal coil 302 may include wire holes between 2 mm and 8 mm in diameter. Of course, it should be understood that the coils 302, 304 may have any suitable number of coil turns, may be of any suitable length, and may have holes of any suitable dimension/diameter.

In certain embodiments, the 2D scanning magnet 300 may further include: an iron yoke (e.g., iron yoke 312) disposed around the vertical field trapezoidal coil 304 and the horizontal field trapezoidal coil 302. Further, in some embodiments, the vertical field trapezoidal coil 304 and the horizontal field trapezoidal coil 302 may be comprised of copper wire.

In some embodiments, the first electrical current input and the second electrical current input may be between approximately 275 amperes (A) and 550 A, and the third electrical current input and the fourth electrical current input may be between approximately 275 A and 550 A. For example, the top coil 304*a* and the bottom coil 304*b* may receive electrical current inputs that are approximately 550 A to accurately steer the input ion beam in the horizontal direction along the central aperture 305 and scan the ion beam across a target volume 108. Similarly, the right coil 302*a* and the left coil 302*b* may receive electrical current inputs that are approximately 275 A to accurately steer the input ion beam in the vertical direction along the central aperture 305 and scan the ion beam across the target volume 108. Of course, it should be understood that the electrical current inputs may be of any suitable values, and may be adjusted to any other suitable values, as necessary.

At block 504, the method 500 may further include scanning the ion beam across the 2D target area in a first direction and a second direction by sequentially adjusting a propagation direction of the ion beam with the 2D scanning magnet. The first direction and the second direction may be orthogonal to the axis.

Aspects

The following list of aspects reflects a variety of the embodiments explicitly contemplated by the present application. Those of ordinary skill in the art will readily appreciate that the aspects below are neither limiting of the embodiments disclosed herein, nor exhaustive of all the embodiments conceivable from the disclosure above, but are instead meant to be exemplary in nature.

Aspect 1. A compact two-dimensional (2D) scanning magnet for scanning ion beams, the compact 2D scanning magnet comprising: a vertical field trapezoidal coil oriented along an axis comprising: a top coil that is configured to receive a first input electrical current flowing through the top coil in a first direction, and a bottom coil that is configured to receive a second input electrical current flowing through the bottom coil in the first direction; and a horizontal field trapezoidal coil that is disposed proximate to the vertical field trapezoidal coil and is rotated about the axis relative to the vertical field trapezoidal coil by an angle, the horizontal field trapezoidal coil comprising: a left coil that is configured to receive a third input electrical current flowing through the left coil in a second direction, and a right coil that is configured to receive a fourth input electrical current flowing through the right coil in the second direction, wherein the vertical field trapezoidal coil and the horizontal field trapezoidal coil are configured to scan an input ion beam across a 2D target area.

Aspect 2. The compact 2D scanning magnet of aspect 1, wherein: the top coil, the bottom coil, the left coil, and the right coil have a first number of coil layers at a first edge of the top coil, the bottom coil, the left coil, and the right coil; and the top coil, the bottom coil, the left coil, and the right coil have a second number of coil layers at a second edge of the top coil, the bottom coil, the left coil, and the right coil, wherein the second number of coil layers is greater than the first number of coil layers, such that the top coil, the bottom coil, the left coil, and the right coil have a trapezoidal cross section.

Aspect 3. The compact 2D scanning magnet of aspect 2, wherein the first number of coil layers is one, and the second number of coil layers is two.

Aspect 4. The compact 2D scanning magnet of any one of aspects 1-3, wherein the vertical field trapezoidal coil and the horizontal field trapezoidal coil are comprised of a square wire that has dimensions between 4 millimeters (mm) by 4 mm and 10 mm by 10 mm.

Aspect 5. The compact 2D scanning magnet of any one of aspects 1-4, wherein the axis is a first axis, and the vertical field trapezoidal coil is rotated relative to the horizontal field trapezoidal coil by an absolute value of 90 degrees relative to a respective second axis that is orthogonal to the first axis.

Aspect 6. The compact 2D scanning magnet of any one of aspects 1-5, wherein the vertical field trapezoidal coil and the horizontal field trapezoidal coil have between 20 and 100 coil turns.

Aspect 7. The compact 2D scanning magnet of any one of aspects 1-6, wherein the vertical field trapezoidal coil is between 60 centimeters (cm) and 80 cm in length, and the horizontal field trapezoidal coil is between 60 cm and 80 cm in length.

Aspect 8. The compact 2D scanning magnet of any one of aspects 1-7, wherein the vertical field trapezoidal coil and the horizontal field trapezoidal coil include wire holes between 2 millimeters (mm) and 8 mm in diameter.

Aspect 9. The compact 2D scanning magnet of any one of aspects 1-8, further comprising: an iron yoke disposed around the vertical field trapezoidal coil and the horizontal field trapezoidal coil.

Aspect 10. The compact 2D scanning magnet of any one of aspects 1-9, wherein the first electrical current input and the second electrical current input are between approximately 275 amperes (A) and 550 A, and the third electrical current input and the fourth electrical current input are between approximately 275 A and 550 A.

Aspect 11. The compact 2D scanning magnet of any one of aspects 1-10, wherein the vertical field trapezoidal coil and the horizontal field trapezoidal coil are comprised of copper wire.

Aspect 12. A system for scanning ion beams, the system comprising: an accelerator for accelerating an ion beam towards a two-dimensional (2D) target area; and a 2D scanning magnet configured to scan the ion beam across the 2D target area, the 2D scanning magnet comprising: a vertical field trapezoidal coil oriented along an axis comprising: a top coil that is configured to receive a first input electrical current flowing through the top coil in a first direction, and a bottom coil that is configured to receive a second input electrical current flowing through the bottom coil in the first direction; and a horizontal field trapezoidal coil that is disposed proximate to the vertical field trapezoidal coil and is rotated about the axis relative to the vertical field trapezoidal coil by an angle, the horizontal field trapezoidal coil comprising: a left coil that is configured to receive a third input electrical current flowing through the left coil in a second direction, and a right coil that is configured to receive a fourth input electrical current flowing through the right coil in the second direction.

Aspect 13. The system of aspect 12, wherein: the top coil, the bottom coil, the left coil, and the right coil have a first number of coil layers at a first edge of the top coil, the bottom coil, the left coil, and the right coil; and the top coil, the bottom coil, the left coil, and the right coil have a second number of coil layers at a second edge of the top coil, the bottom coil, the left coil, and the right coil, wherein the second number of coil layers is greater than the first number of coil layers, such that the top coil, the bottom coil, the left coil, and the right coil have a trapezoidal cross section.

Aspect 14. The system of any one of aspects 12-13, wherein the vertical field trapezoidal coil and the horizontal field trapezoidal coil are comprised of a square wire that has dimensions between 4 millimeters (mm) by 4 mm and 10 mm by 10 mm.

Aspect 15. The system of any one of aspects 12-14, wherein the axis is a first axis, and the vertical field trapezoidal coil is rotated relative to the horizontal field trapezoidal coil by an absolute value of 90 degrees relative to a respective second axis that is orthogonal to the first axis.

Aspect 16. The system of any one of aspects 12-15, wherein the vertical field trapezoidal coil and the horizontal field trapezoidal coil have between 20 and 100 coil turns.

Aspect 17. The system of any one of aspects 12-16, wherein the vertical field trapezoidal coil and the horizontal field trapezoidal coil include wire holes between 2 millimeters (mm) and 8 mm in diameter.

Aspect 18. The system of any one of aspects 12-17, wherein the first electrical current input and the second electrical current input are between approximately 275 amperes (A) and 550 A, and the third electrical current input and the fourth electrical current input are between approximately 275 A and 550 A.

Aspect 19. The system of any one of aspects 12-18, wherein the vertical field trapezoidal coil is configured to generate a magnetic field between 0.3 Tesla (T) and 1 T, and the horizontal field trapezoidal coil is configured to generate a magnetic field between 0.3 T and 1 T.

Aspect 20. A method for scanning ion beams, the method comprising: directing an ion beam along an axis towards a 2D scanning magnet configured to scan the ion beam across a 2D target area, the 2D scanning magnet comprising: a vertical field trapezoidal coil oriented along an axis comprising: a top coil that is configured to receive a first input electrical current flowing through the top coil in a first direction, and a bottom coil that is configured to receive a second input electrical current flowing through the bottom coil in the first direction; and a horizontal field trapezoidal coil that is disposed proximate to the vertical field trapezoidal coil and is rotated about the axis relative to the vertical field trapezoidal coil by an angle, the horizontal field trapezoidal coil comprising: a left coil that is configured to receive a third input electrical current flowing through the left coil in a second direction, and a right coil that is configured to receive a fourth input electrical current flowing through the right coil in the second direction; and scanning the ion beam across the 2D target area in a first direction and a second direction by sequentially adjusting a propagation direction of the ion beam with the 2D scanning magnet, wherein the first direction and the second direction are orthogonal to the axis.

Additional Considerations

The following additional considerations apply to the foregoing discussion. Throughout this specification, plural instances may implement functions, components, operations, or structures described as a single instance. Although individual functions and instructions of one or more methods are illustrated and described as separate operations, one or more of the individual operations may be performed concurrently, and nothing requires that the operations be performed in the order illustrated. Structures and functionality presented as separate components in exemplary configurations may be implemented as a combined structure or component. Similarly, structures and functionality presented as a single component may be implemented as separate components. These and other variations, modifications, additions, and improvements fall within the scope of the subject matter herein.

As used herein any reference to “some embodiments” or “one embodiment” or “an embodiment” means that a particular element, feature, structure, or characteristic described in connection with the embodiment is included in at least one embodiment. The appearances of the phrase “in one embodiment” in various places in the specification are not necessarily all referring to the same embodiment.

Some embodiments may be described using the expression “coupled” and “connected” along with their derivatives. For example, some embodiments may be described using the term “coupled” to indicate that two or more elements are in direct physical or electrical contact. The term “coupled,” however, may also mean that two or more elements are not in direct contact with each other, but yet still co-operate or interact with each other. The embodiments are not limited in this context.

As used herein, the terms “comprises,” “comprising,” “includes,” “including,” “has,” “having” or any other variation thereof, are intended to cover a non-exclusive inclusion. For example, a function, process, method, article, or apparatus that comprises a list of elements is not necessarily limited to only those elements but may include other elements not expressly listed or inherent to such process, method, article, or apparatus. Further, unless expressly stated to the contrary, “or” refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the “a” or “an” are employed to describe elements and components of the embodiments herein. This is done merely for convenience and to give a general sense of the description. This description should be read to include one or at least one and the singular also includes the plural unless it is obvious that it is meant otherwise.

Still further, the figures depict preferred embodiments of a system 100 for purposes of illustration only. One of ordinary skill in the art will readily recognize from the following discussion that alternative embodiments of the structures and methods illustrated herein may be employed without departing from the principles described herein.

Upon reading this disclosure, those of skill in the art will appreciate still additional alternative structural and functional designs for methods and systems for scanning ion beams through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A compact two-dimensional (2D) scanning magnet for scanning ion beams, the compact 2D scanning magnet comprising:
- a vertical field trapezoidal coil oriented along an axis comprising:
  - a top coil that is configured to receive a first input electrical current flowing through the top coil in a first direction, and
  - a bottom coil that is configured to receive a second input electrical current flowing through the bottom coil in the first direction; and
- a horizontal field trapezoidal coil that is disposed proximate to the vertical field trapezoidal coil and is rotated about the axis relative to the vertical field trapezoidal coil by an angle, the horizontal field trapezoidal coil comprising:
  - a left coil that is configured to receive a third input electrical current flowing through the left coil in a second direction, and
  - a right coil that is configured to receive a fourth input electrical current flowing through the right coil in the second direction,
- wherein the vertical field trapezoidal coil and the horizontal field trapezoidal coil are configured to scan an input ion beam across a 2D target area.

2. The compact 2D scanning magnet of claim 1, wherein:
- the top coil, the bottom coil, the left coil, and the right coil have a first number of coil layers at a first edge of the top coil, the bottom coil, the left coil, and the right coil; and the top coil, the bottom coil, the left coil, and the right coil have a second number of coil layers at a second edge of the top coil, the bottom coil, the left coil, and the right coil, wherein the second number of coil layers is greater than the first number of coil layers, such that the top coil, the bottom coil, the left coil, and the right coil have a trapezoidal cross section.

3. The compact 2D scanning magnet of claim 2, wherein the first number of coil layers is one, and the second number of coil layers is two.

4. The compact 2D scanning magnet of claim 1, wherein the vertical field trapezoidal coil and the horizontal field trapezoidal coil are comprised of a square wire that has dimensions between 4 millimeters (mm) by 4 mm and 10 mm by 10 mm.

5. The compact 2D scanning magnet of claim 1, wherein the axis is a first axis, and the vertical field trapezoidal coil is rotated relative to the horizontal field trapezoidal coil by an absolute value of 90 degrees relative to a respective second axis that is orthogonal to the first axis.

6. The compact 2D scanning magnet of claim 1, wherein the vertical field trapezoidal coil and the horizontal field trapezoidal coil have between 20 and 100 coil turns.

7. The compact 2D scanning magnet of claim 1, wherein the vertical field trapezoidal coil is between 60 centimeters (cm) and 80 cm in length, and the horizontal field trapezoidal coil is between 60 cm and 80 cm in length.

8. The compact 2D scanning magnet of claim 1, wherein the vertical field trapezoidal coil and the horizontal field trapezoidal coil include wire holes between 2 millimeters (mm) and 8 mm in diameter.

9. The compact 2D scanning magnet of claim 1, further comprising:

an iron yoke disposed around the vertical field trapezoidal coil and the horizontal field trapezoidal coil.

10. The compact 2D scanning magnet of claim 1, wherein the first electrical current input and the second electrical current input are between approximately 275 amperes (A) and 550 A, and the third electrical current input and the fourth electrical current input are between approximately 275 A and 550 A.

11. The compact 2D scanning magnet of claim 1, wherein the vertical field trapezoidal coil and the horizontal field trapezoidal coil are comprised of copper wire.

12. A system for scanning ion beams, the system comprising:

an accelerator for accelerating an ion beam towards a two-dimensional (2D) target area; and a 2D scanning magnet configured to scan the ion beam across the 2D target area, the 2D scanning magnet comprising:

a vertical field trapezoidal coil oriented along an axis comprising:

a top coil that is configured to receive a first input electrical current flowing through the top coil in a first direction, and a bottom coil that is configured to receive a second input electrical current flowing through the bottom coil in the first direction; and a horizontal field trapezoidal coil that is disposed proximate to the vertical field trapezoidal coil and is rotated about the axis relative to the vertical field trapezoidal coil by an angle, the horizontal field trapezoidal coil comprising:

a left coil that is configured to receive a third input electrical current flowing through the left coil in a second direction, and a right coil that is configured to receive a fourth input electrical current flowing through the right coil in the second direction.

13. The system of claim 12, wherein:

the top coil, the bottom coil, the left coil, and the right coil have a first number of coil turns at a first layer of the top coil, the bottom coil, the left coil, and the right coil; and the top coil, the bottom coil, the left coil, and the right coil have a second number of coil turns at a second layer of the top coil, the bottom coil, the left coil, and the right coil, wherein the second number of coil turns is greater than the first number of coil turns, such that the top coil, the bottom coil, the left coil, and the right coil have a trapezoidal cross section.

14. The system of claim 12, wherein the vertical field trapezoidal coil and the horizontal field trapezoidal coil are comprised of a square wire that has dimensions between 4 millimeters (mm) by 4 mm and 10 mm by 10 mm.

15. The system of claim 12, wherein the axis is a first axis, and the vertical field trapezoidal coil is rotated relative to the horizontal field trapezoidal coil by an absolute value of 90 degrees relative to a respective second axis that is orthogonal to the first axis.

16. The system of claim 12, wherein the vertical field trapezoidal coil and the horizontal field trapezoidal coil have between 20 and 100 coil turns.

17. The system of claim 12, wherein the vertical field trapezoidal coil and the horizontal field trapezoidal coil include wire holes between 2 millimeters (mm) and 8 mm in diameter.

18. The system of claim 12, wherein the first electrical current input and the second electrical current input are between approximately 275 amperes (A) and 550 A, and the third electrical current input and the fourth electrical current input are between approximately 275 A and 550 A.

19. The system of claim 12, wherein the vertical field trapezoidal coil is configured to generate a magnetic field between 0.3 Tesla (T) and 1.0 T, and the horizontal field trapezoidal coil is configured to generate a magnetic field between 0.3 T and 1 T.

20. A method for scanning ion beams, the method comprising:

directing an ion beam along an axis towards a 2D scanning magnet configured to scan the ion beam across a 2D target area, the 2D scanning magnet comprising:

a vertical field trapezoidal coil oriented along an axis comprising:

a top coil that is configured to receive a first input electrical current flowing through the top coil in a first direction, and a bottom coil that is configured to receive a second input electrical current flowing through the bottom coil in the first direction; and a horizontal field trapezoidal coil that is disposed proximate to the vertical field trapezoidal coil and is rotated about the axis relative to the vertical field trapezoidal coil by an angle, the horizontal field trapezoidal coil comprising:

a left coil that is configured to receive a third input electrical current flowing through the left coil in a second direction, and a right coil that is configured to receive a fourth input electrical current flowing through the right coil in the second direction; and scanning the ion beam across the 2D target area in a first direction and a second direction by sequentially adjusting a propagation direction of the ion beam with the 2D scanning magnet, wherein the first direction and the second direction are orthogonal to the axis.

* * * * *